(12) United States Patent
Yamanaka et al.

(10) Patent No.: US 9,203,213 B2
(45) Date of Patent: Dec. 1, 2015

(54) SEMICONDUCTOR LIGHT-EMITTING DEVICE

(71) Applicant: PANASONIC CORPORATION, Osaka (JP)

(72) Inventors: Kazuhiko Yamanaka, Osaka (JP); Shinji Yoshida, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/462,509

(22) Filed: Aug. 18, 2014

(65) Prior Publication Data

US 2015/0023376 A1 Jan. 22, 2015

Related U.S. Application Data

(63) Continuation of application No. PCT/JP2013/000398, filed on Jan. 25, 2013.

(30) Foreign Application Priority Data

Mar. 2, 2012 (JP) .................................. 2012-046198

(51) Int. Cl.
  *H01L 27/15* (2006.01)
  *H01L 29/22* (2006.01)
  (Continued)

(52) U.S. Cl.
  CPC ........... *H01S 5/02469* (2013.01); *H01S 5/0208* (2013.01); *H01S 5/02256* (2013.01); *H01S5/02484* (2013.01); *H01S 5/02212* (2013.01); *H01S 5/02216* (2013.01); *H01S 5/02272* (2013.01); *H01S 5/0425* (2013.01)

(58) Field of Classification Search
  CPC .............. H01S 5/02469; H01S 5/0208; H01S 5/02272; H01S 5/0425

USPC ............... 257/80–84, 99, 414, 459, 467, 469; 438/22, 24–27, 48, 121, 122; 362/249.02, 249.06
See application file for complete search history.

(56) References Cited

U.S. PATENT DOCUMENTS 8,048,692 B2 * 11/2011 Horng et al. .................... 438/22
2005/0141575 A1    6/2005 Lorenzen
(Continued)

FOREIGN PATENT DOCUMENTS

JP        60-211992 A     10/1985
JP        01-181490 A      7/1989
(Continued)

OTHER PUBLICATIONS

International Search Report issued in International Application No. PCT/JP2013/000398 with Date of mailing Mar. 5, 2013, with English Translation.

*Primary Examiner* — Hsien Ming Lee
(74) *Attorney, Agent, or Firm* — McDermott Will & Emery LLP

(57) ABSTRACT

A semiconductor light-emitting device includes a first heat sink and a second heat sink both formed of an insulating member and facing and thermally connected to each other, and a semiconductor light-emitting element. The semiconductor light-emitting element is held in a cavity between the first heat sink and the second heat sink. The second heat sink has a first electrode and a second electrode on a surface facing the first heat sink, and a third electrode and a fourth electrode on a surface opposite to the surface facing the first heat sink. The first electrode is connected to a lower electrode of the light-emitting element. The second electrode is connected to an upper electrode of the light-emitting element. The first electrode and the third electrode are connected to each other, and the second electrode and the fourth electrode are connected to each other.

12 Claims, 18 Drawing Sheets

(51) Int. Cl.
  *H01L 27/14* (2006.01)
  *H01L 31/058* (2006.01)
  *H01L 21/00* (2006.01)
  *H01L 21/48* (2006.01)
  *H01S 5/024* (2006.01)
  *H01S 5/02* (2006.01)
  *H01S 5/022* (2006.01)
  *H01S 5/042* (2006.01)

(56) References Cited

U.S. PATENT DOCUMENTS

2009/0080485 A1  3/2009  Yamasaki et al.
2010/0007013 A1* 1/2010  Kuroda et al. .............. 257/712
2010/0213471 A1  8/2010  Fukasawa et al.

FOREIGN PATENT DOCUMENTS

| JP | 02-306681 A | 12/1990 |
| JP | 08-228044 A | 9/1996 |
| JP | 08-228045 A | 9/1996 |
| JP | 2001-036180 A | 2/2001 |
| JP | 2004-103735 A | 4/2004 |
| JP | 2004-146720 A | 5/2004 |
| JP | 2005-032937 A | 2/2005 |
| JP | 2006-032498 A | 2/2006 |
| JP | 2006-351728 A | 12/2006 |
| JP | 2009-043766 A | 2/2009 |
| JP | 2009-076730 A | 4/2009 |

* cited by examiner

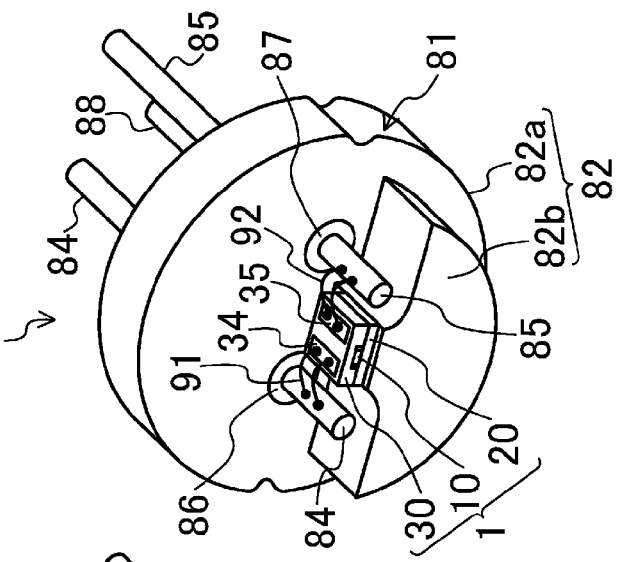
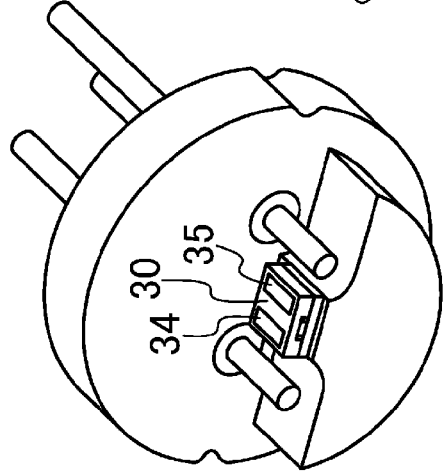
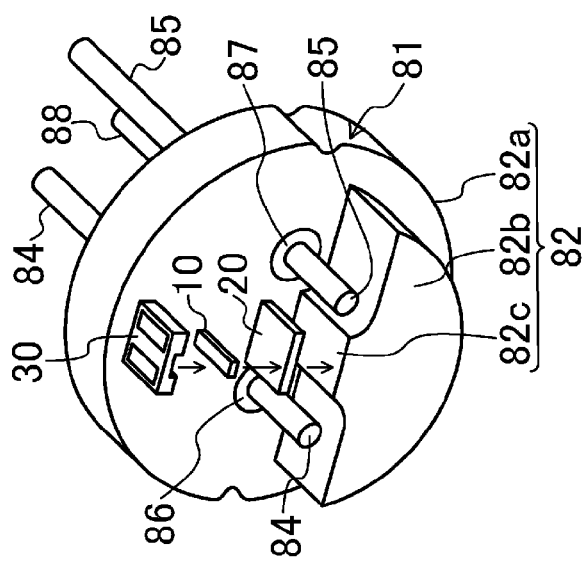

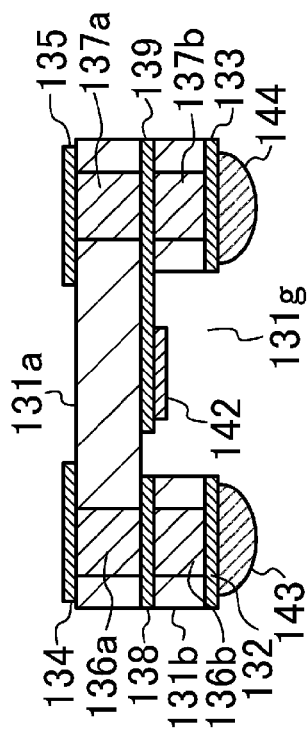
FIG.9A
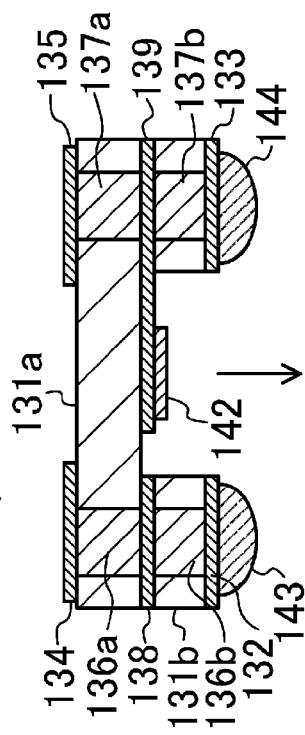
FIG.9D
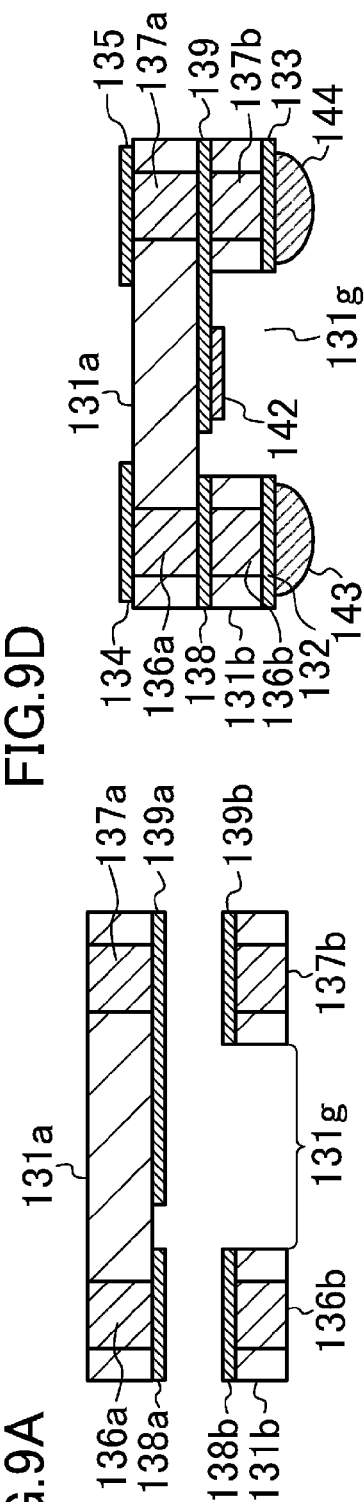
FIG.9B
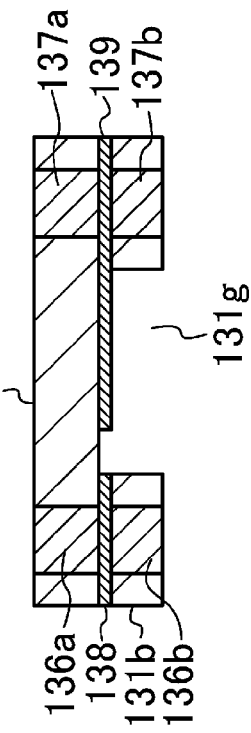
FIG.9C
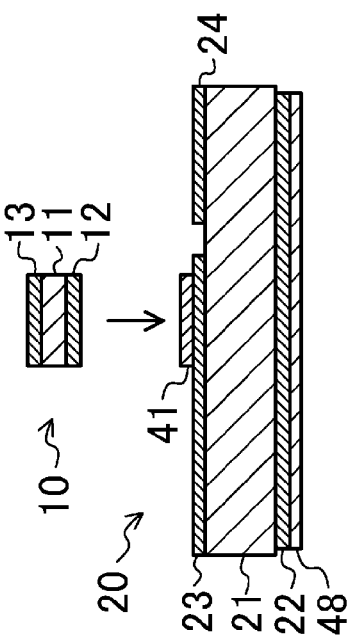
FIG.9E
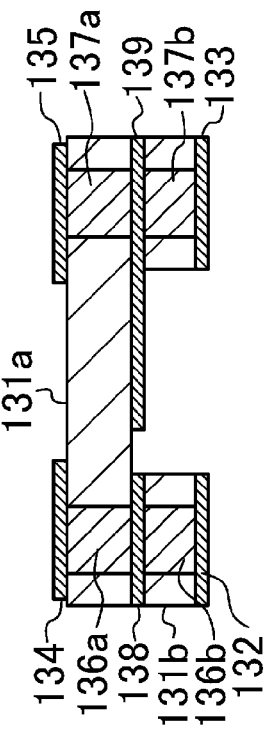

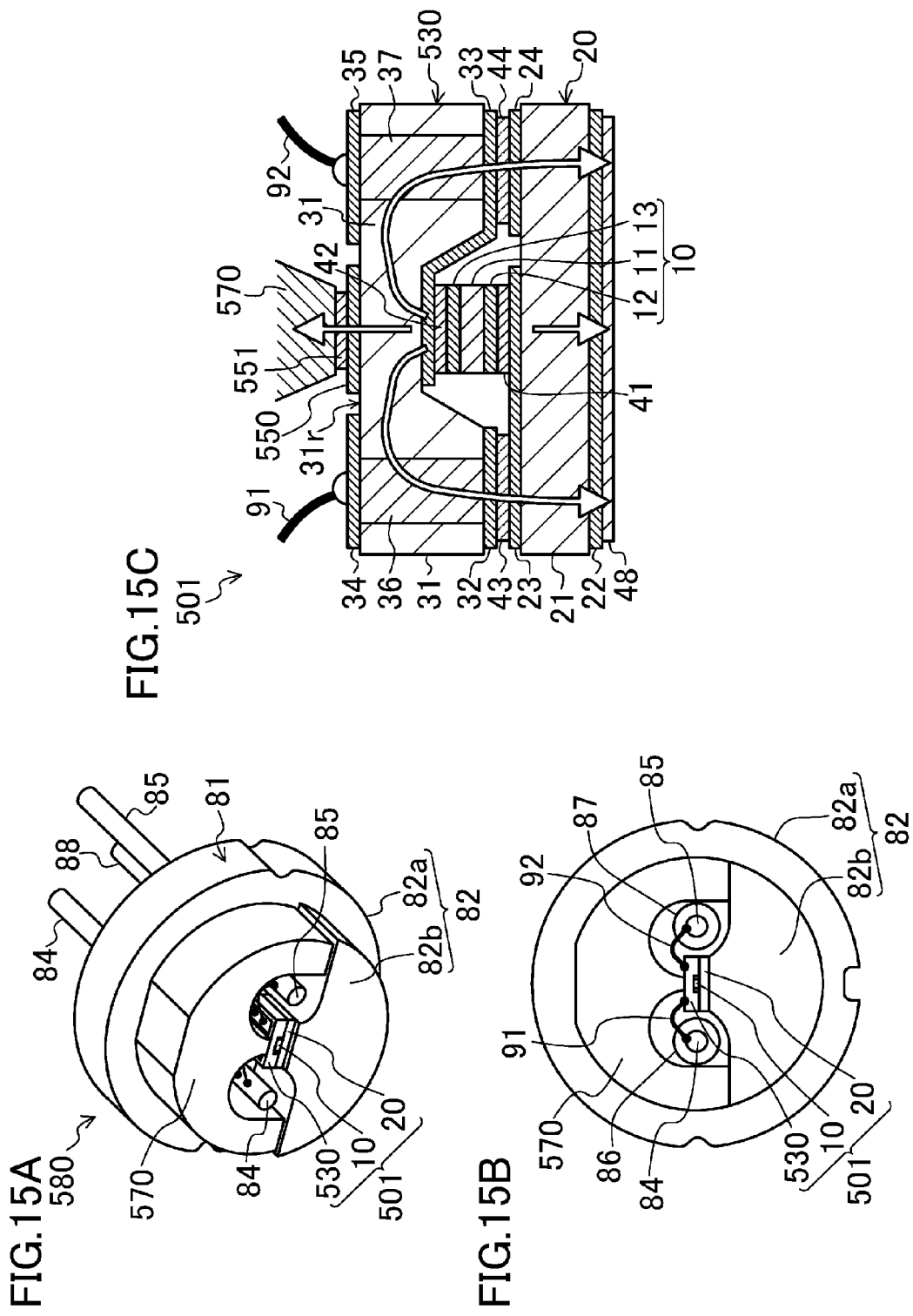

SEMICONDUCTOR LIGHT-EMITTING DEVICE

CROSS-REFERENCE TO RELATED APPLICATIONS

This is a continuation of International Application No. PCT/JP2013/000398 filed on Jan. 25, 2013, which claims priority to Japanese Patent Application No. 2012-046198 filed on Mar. 2, 2012. The entire disclosures of these applications are incorporated by reference herein.

BACKGROUND

The present disclosure relates to semiconductor light-emitting devices using semiconductor light-emitting elements which consume relatively large electric power.

Semiconductor light-emitting devices using a semiconductor light-emitting element, such as a semiconductor laser element made of a (In, Al, Ga, P) based, (In, Al, Ga, As) based, or (In, Al, Ga, N) based compound semiconductor have been actively developed as a light source of image display devices such as a laser display or a projector, an excitation light source of a solid light source for illumination, and a light source of processing equipment for industrial use, such as a laser scribing device or a thin film annealing device. These semiconductor light-emitting devices emit very high energy light whose optical output exceeds 1 W. The electric power consumed by the semiconductor light-emitting elements accordingly increases, and the amount of heat dissipated from the semiconductor light-emitting elements also increases. Thus, various measures need to be taken on packages to which the semiconductor light-emitting elements are mounted.

One of structures of packages of most commonly used semiconductor light-emitting devices at present is a so-called CAN type which includes a disc-like base member to be fixed to an external member, and in which a post for fixing a semiconductor light-emitting element vertically with respect to a principal surface of the base member, and a lead pin for applying electricity to an anode or a cathode of the semiconductor light-emitting element are attached to the base member. For example, a semiconductor light-emitting element is mounted on the CAN type package, with a ceramic (e.g., AlN) submount interposed therebetween, and a lead and the semiconductor light-emitting element are electrically connected together by a fine gold wire, thereby forming a semiconductor light-emitting device.

Techniques for particularly improving heat dissipation properties in the above conventional package structure are disclosed in the following Patent Documents 1, 2 and 3.

First, a semiconductor light-emitting device disclosed in Patent Document 1 (Japanese Unexamined Patent Publication No. 2005-032937) will be described with reference to FIG. 18. FIG. 18 is a package portion of a light-emitting device 700, in which a post 705 is adhered to a surface of a disc-like base 715 with an adhesive 714, and in which three leads 716, 717 and 718 penetrate the front and back surfaces of the base 715. A submount 703 is attached to the principal surface of the post 705 with the adhesive 704 interposed therebetween. An electrode 708 is provided on the principal surface of the submount 703. A nitride semiconductor laser element 701 is adhered to the electrode 708 with solder 702 interposed therebetween. A light-emitting portion 706 of the nitride semiconductor laser element 701 is on the submount 703 side. A square U-shaped heat sink 711 is adhered to a surface of the nitride semiconductor laser element 701 which is opposite to the light-emitting portion 706, with the recess of the U-shape facing the principal surface of the submount 703. For example, the bottom face of the recess of the heat sink 711 is adhered to the upper surface of the nitride semiconductor laser element 701 with an adhesive 712 interposed therebetween. Further, the two outside lower surfaces of the heat sink 711 are adhered to the principal surface of the post 705 with an adhesive 713 interposed therebetween.

In this structure, properties of the heat dissipation from the nitride semiconductor laser element 701 to the base 715 are improved to some extent, but are not enough because the length of the post 705 needs to be sufficiently longer than the length of the nitride semiconductor laser element 701 so that the nitride semiconductor laser element 701 surrounded by the submount 703 and the heat sink 711 can be electrically connected to an external member, that is, because the electrode 708 needs to be provided between the nitride semiconductor laser element 701 and the base 715 to connect the lead 717 and the nitride semiconductor laser element 701 by a fine gold wire 709. Thus, the distance between the nitride semiconductor laser element 701 and the base 715 is increased, and the length of a heat dissipation path is therefore also increased. As a result, the heat dissipation properties of the semiconductor light-emitting device 700 are deteriorated.

Patent Document 2 (Japanese Unexamined Patent Publication No. 2009-076730) and Patent Document 3 (Japanese Unexamined Patent Publication No. 2004-103735) disclose a configuration in which a heat sink itself serves as an electric interconnect. For example, FIG. 9 is a conventional semiconductor light-emitting device 800 having a structure in which a plurality of nitride semiconductor laser elements 801 are sandwiched and held between a conductive first submount 802 and a conductive second submount 804, with solder materials 803, 805 interposed therebetween. The first submount 802 and the second submount 804 are adhered to the base 806 with a solder material (not shown). The first submount 802 and the second submount 804 are provided on the base 806, and are respectively connected to two conductive regions electrically insulated from each other.

SUMMARY

However, for more detailed design of the above-described conventional semiconductor light-emitting device, various aspects including not only the thermal design of the package including the heat dissipation properties to the outside, and the package terminal design connecting the semiconductor laser element to an external circuit, but also properties and costs of each of the members comprising the semiconductor light-emitting device, and fabrication costs need to be considered. Thus, the design may become complicated.

Specifically, in the conventional semiconductor light-emitting device, it is suggested to use conductive materials, e.g., silicon carbide (SiC), copper (Cu), copper tungsten (CuW), aluminum nitride (AlN), diamond (C), copper molybdenum (CuMo) or silver (Ag) as the first submount and the second submount to supply electric power to the semiconductor laser element.

However, these materials are expensive, or have a significant difference in the thermal expansion coefficient from the semiconductor laser element. Therefore, the long-term reliability of the semiconductor light-emitting element may be decreased.

Further, in the conventional semiconductor light-emitting device, the base needs to be adhered to a surface perpendicular to the surfaces of the first submount and second submount to which the semiconductor laser element is connected. Thus, in order to reduce a thermal contact resistance between the base and the first and second submounts, and increase the heat dissipation properties, the flatness and the accuracy of position of the contact surfaces of the first submount and the second submount with the base need to very high.

The present disclosure is thus intended to solve the above problems and provide a configuration which efficiently dissipates Joule heat generated in the semiconductor light-emitting element to the outside of a package by a simple method.

To achieve the above objectives, the present disclosure provides a configuration of the semiconductor light-emitting device in which a semiconductor light-emitting element is sandwiched in a cavity between two insulating heat sinks such that the semiconductor light-emitting element is thermally and electrically connected to the outside.

Specifically, a semiconductor light-emitting device of the present disclosure includes: a first heat sink formed of an insulating member; a second heat sink formed of an insulating member, facing the first heat sink with a cavity therebetween, and thermally connected to the first heat sink; and a semiconductor light-emitting element held in the cavity and connected to the first heat sink and the second heat sink, wherein the second heat sink has a first electrode and a second electrode on a first surface facing the first heat sink, and a third electrode and a fourth electrode on a second surface opposite to the first surface, the first electrode is electrically connected to a lower electrode of the semiconductor light-emitting element, the second electrode is electrically connected to an upper electrode of the semiconductor light-emitting element, and the first electrode and the third electrode are electrically connected to each other, and the second electrode and the fourth electrode are electrically connected to each other.

According to the semiconductor light-emitting device of the present disclosure, Joule heat generated in the semiconductor light-emitting element can be efficiently dissipated by the two heat sinks sandwiching the semiconductor light-emitting element. Moreover, the lower electrode and the upper electrode included in the semiconductor light-emitting element can be electrically connected to the outside easily.

In the semiconductor light-emitting device of the present disclosure, the first electrode and the third electrode may be electrically connected to each other by a first via electrode which penetrates the second heat sink, and the second electrode and the fourth electrode may be electrically connected to each other by a second via electrode which penetrates the second heat sink.

In the semiconductor light-emitting device of the present disclosure, the first electrode and the third electrode may be electrically connected to each other by a first conductive film formed on one of side surfaces of the second heat sink, and the second electrode and the fourth electrode may be electrically connected to each other by a second conductive film formed on the other side surface of the second heat sink.

In the semiconductor light-emitting device of the present disclosure, the cavity may be a recess formed in at least one of the first heat sink or the second heat sink.

In the semiconductor light-emitting device of the present disclosure, the cavity may be a cavity between two conductive members placed between the first heat sink and the second heat sink.

In the semiconductor light-emitting device of the present disclosure, each of the first heat sink and the second heat sink may be formed of an insulating material having a first thermal expansion coefficient, the semiconductor light-emitting element may be formed of a material having a second thermal expansion coefficient, and a thermal expansion coefficient difference between the first thermal expansion coefficient and the second thermal expansion coefficient may be within a range of −40% to 40%.

In this case, the insulating material may be aluminum nitride ceramic, silicon carbide ceramic, alumina ceramic, or silicon.

The semiconductor light-emitting device of the present disclosure may further include: a base to which the first heat sink is adhered; and a first lead pin and a second lead pin electrically insulated from the base, wherein the third electrode may be electrically connected to the first lead pin, and the fourth electrode may be electrically connected to the second lead pin.

In this case, in the semiconductor light-emitting device, the base may include a post which is thermally conductive, and a base body which holds the first lead pin and the second lead pin.

Moreover, in this case, the semiconductor light-emitting device may further include a heat dissipation block which is thermally connected to portions of an upper surface of the post at lateral side areas of the first heat sink, and to an upper surface of the second heat sink.

Further, in the case that the base is provided, the base may be comprised of a base body to which a third lead pin is connected, and the semiconductor light-emitting device may further include a package that holds the base body, the first lead pin, the second lead pin, and the third lead pin.

Further, in the case that the base is provided, the semiconductor light-emitting device may further include an interconnect member which electrically connects the third electrode and the first lead pin, and electrically connects the fourth electrode and the second lead pin, wherein the interconnect member includes a first interconnect electrically connected to the first lead pin, a second interconnect electrically connected to the second lead pin, and an insulating member which holds the first interconnect and the second interconnect.

According to a semiconductor light-emitting device of the present disclosure, a configuration which efficiently dissipates Joule heat generated in the semiconductor light-emitting element to the outside a package by a simple method.

BRIEF DESCRIPTION OF THE DRAWINGS

FIGS. 5A-5C show oblique views of the semiconductor light-emitting device of FIG. 4 in the order of steps of the fabrication method.

FIG. 9A to FIG. 9E show cross-sectional views of the semiconductor light-emitting device of the first variation of the first embodiment in the order of steps of a fabrication method.

FIG. 15A is an oblique view of a semiconductor light-emitting device of the second embodiment. FIG. 15B is a front view of the semiconductor light-emitting device of the second embodiment. FIG. 15C is a cross-sectional view of a semiconductor light-emitting device mounted on the semiconductor light-emitting device of the second embodiment.

DETAILED DESCRIPTION (First Embodiment)

A semiconductor light-emitting device of the first embodiment will be described with reference to FIG. 1 to FIG. 7.

Figure 1:
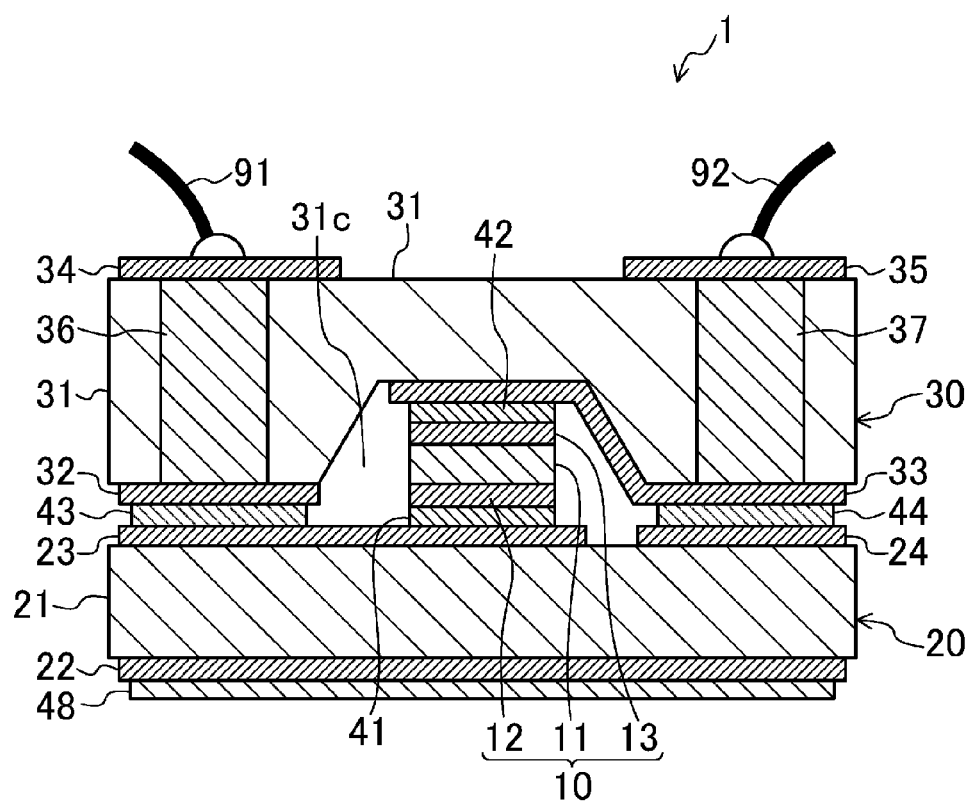
FIG. 1 is a cross-sectional view of a semiconductor light-emitting device of the first embodiment.
Figure 2:
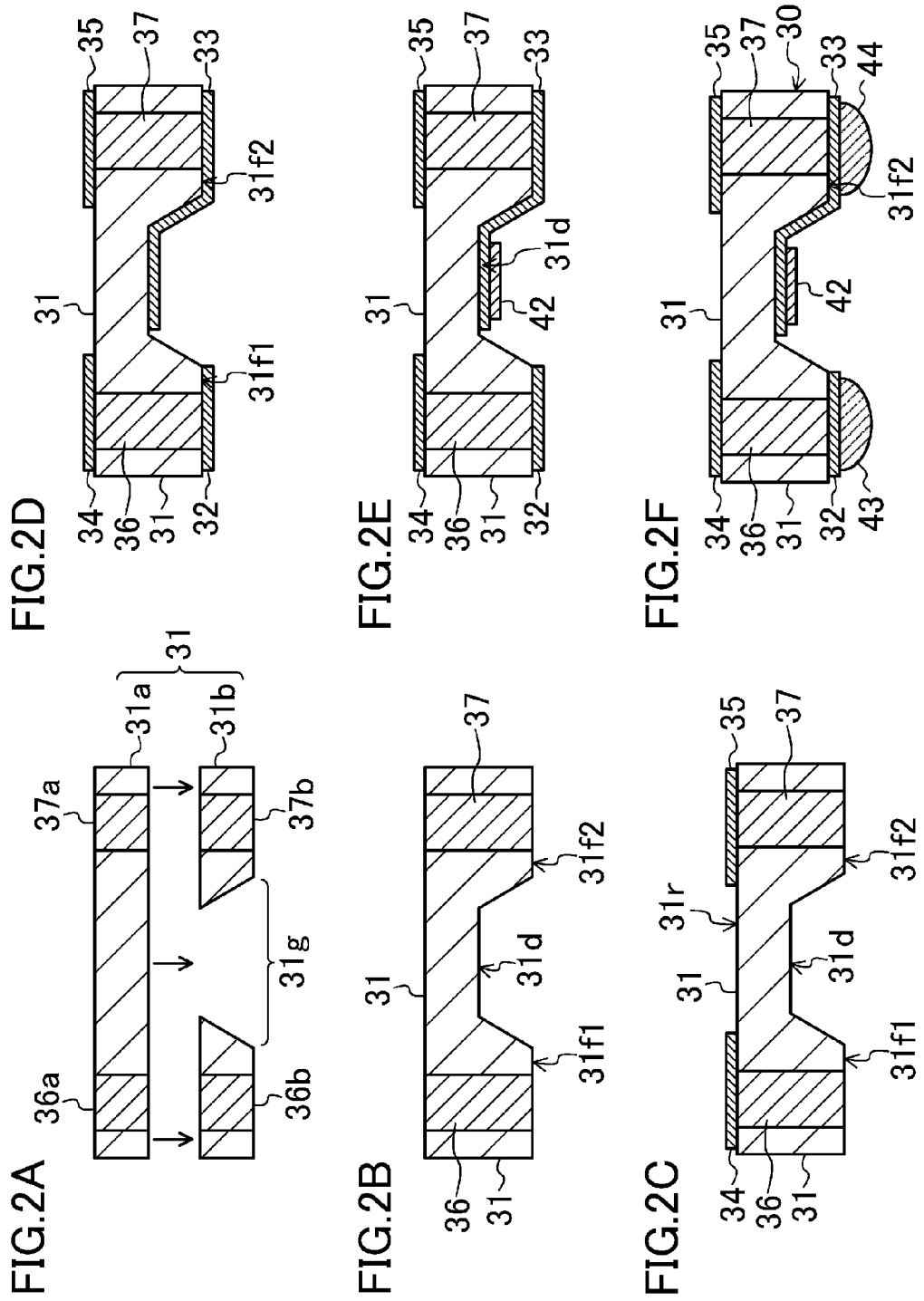
FIG. 2A to FIG. 2F show cross-sectional views of the semiconductor light-emitting device of the first embodiment in the order of steps of a fabrication method.

As shown in FIG. 1, in a semiconductor light-emitting device 1 of the first embodiment, a semiconductor light-emitting element 10 is sandwiched between a first heat sink 20 which is thermally and electrically connected to a lower surface of the semiconductor light-emitting element 10, and a second heat sink 30 which is thermally and electrically connected to an upper surface of the semiconductor light-emitting element 10.

The semiconductor light-emitting element 10 is a light-emitting element which emits light from a side face, i.e., an edge face of a semiconductor light-emitting chip, such as a semiconductor laser element or a super luminescent diode formed of a (In, Al, Ga, P) based, (In, Al, Ga, As) based, or (In, Al, Ga, N) based compound semiconductor, for example.

The first heat sink 20 includes: an insulating substrate 21 made of an insulating material whose thermal expansion coefficient is close to the thermal expansion coefficient of a semiconductor material forming the semiconductor light-emitting element 10; a metal thin film patterned on a surface of the insulating substrate 21 and made, for example, of gold (Au) for forming an electrode; and a solder material formed on the metal thin film and made, for example, of a gold-tin (AuSn) alloy for connecting with the element. Aluminum nitride (AlN) ceramic, silicon carbide (SiC) ceramic, alumina ($Al_2O_3$) ceramic, or silicon (Si), etc., can be used as the insulating substrate 21. The thermal expansion coefficient of the compound semiconductor used as the semiconductor light-emitting element 10 is in a range of from about $4 \times 10^{-6}$/K to about $7 \times 10^{-6}$/K. The outer dimensions of the semiconductor light-emitting element 10 are 500 μm to 2000 μm in its longitudinal direction, with a thickness of 50 μm to 150 μm, for example. The temperature of a light-emitting portion of the semiconductor light-emitting element 10 varies from a room temperature (about 20° C.) to about 200° C. By using the above materials as a material forming the insulating substrate 21, a thermal expansion coefficient difference between the material forming the insulating substrate 21 and the semiconductor forming the semiconductor light-emitting element 10 can be sufficiently reduced to within a range of −40% to 40%, and an expansion difference due to thermal expansion can be sufficiently reduced to 1 μm or less at the maximum.

The second heat sink 30 is provided with a cavity 31c that is a recess formed at a portion corresponding to the semiconductor light-emitting element 10. The second heat sink 30 is configured to sandwich the semiconductor element 10 in the recess. Similar to the first heat sink 20, the second heat sink 30 includes: an insulating substrate 31 made of an insulating material whose thermal expansion coefficient is close to the thermal expansion coefficient of the semiconductor material forming the semiconductor light-emitting element 10; a metal thin film patterned on a surface of the insulating substrate 31 and made, for example, of gold (Au) for forming an electrode; and a solder material formed on the metal thin film and made, for example, of a gold-tin (AuSn) alloy for connection with the element. Aluminum nitride (AlN) ceramic, silicon carbide (SiC) ceramic, alumina ($Al_2O_3$) ceramic, or silicon (Si), etc., can be used as the insulating substrate 31. Since the insulating substrates 21, 31 are made of materials whose thermal expansion coefficients are close to the thermal expansion coefficient of the semiconductor material forming the semiconductor light-emitting element 10 as described above, stress that is caused by a difference in thermal expansion coefficient between the semiconductor light-emitting element 10 and the heat sinks 20, 30 due to heat applied during fabrication and heat generated during operation, is reduced. As a result, the long-term reliability of the semiconductor light-emitting element 10 and the semiconductor light-emitting device 1 can be obtained.

As another feature of the second heat sink 30, conductive via electrodes 36, 37 are formed in the second heat sink 30 such that they penetrate the insulating substrate 31 vertically. For example, the via electrode 36 connects a first electrode 32 formed on a lower surface of the insulating substrate 31 and a third electrode 34 formed on an upper surface of the insulating substrate 31. For example, the via electrode 37 connects a second electrode 33 formed on the lower surface of the insulating substrate 31 and the fourth electrode 35 formed on the upper surface of the insulating substrate 31.

The recess formed in the second heat sink 30 is not limited to such a structure. The recess may be formed in an area of the first heat sink 20 facing the semiconductor light-emitting element 10, instead of in the second heat sink 30, or may be formed in both of the first heat sink 20 and the second heat sink 30. In other words, it is only necessary to provide such a cavity 31c that allows the upper and lower surfaces of the semiconductor light-emitting element 10 to be connected to the first heat sink 20 and the second heat sink 30 in the state where the first heat sink 20 and the second heat sink 30 face each other and are connected together.

More details will be described below.

The semiconductor light-emitting element 10 includes a lower electrode 12 provided on a lower surface of a stacking semiconductor structure 11 and an upper electrode 13 provided on an upper surface of the stacking semiconductor structure 11. In FIG. 1, the semiconductor light-emitting element 10 is in a rectangular parallelepiped shape of which the long side extends in a direction vertical to the drawing sheet. The stacking semiconductor structure 11 is formed of stacked semiconductor films, such as an n-type semiconductor substrate, an n-type buffer layer, an n-type cladding layer, an n-type guide layer, a light-emitting layer, a p-type guide layer, and a p-type cladding layer, for example. Each of the lower electrode 12 and the upper electrode 13 is formed of a plurality of metals selected from titanium (Ti), chromium (Cr), nickel (Ni), gold germanium (AuGe), platinum (Pt), palladium (Pd), silver (Ag), and gold (Au), for example, and stacked together. Each of the lower electrode 12 and the upper electrode 13 forms an ohmic contact with the stacking semiconductor structure 11.

In the first heat sink 20, a first conductive film 22 formed of sequentially stacked titanium (Ti)/platinum (Pt)/gold (Au), for example, and an adhesive layer 48 formed of AuSn solder (i.e., an alloy of gold (Au) and tin (Sn)), for example, are sequentially provided on a lower surface of the insulating substrate 21 formed of an aluminum nitride (AlN) ceramic, for example, which is opposite to the surface where the semiconductor light-emitting element 10 is provided. A second conductive film 23 and a third conductive film 24 insulated from each other and formed of a stacked metal of Ti/Pt/Au are patterned on the upper surface of the insulating substrate 21. The second conductive film 23 extends from a region under the via electrode 36 to a region under the semiconductor light-emitting element 10. An adhesive layer 41 formed of AuSn solder, for example, is patterned on the upper surface of the second conductive film 23 under the semiconductor light-emitting element 10, for being connected to the lower electrode 12.

In the second heat sink 30, via electrodes 36, 37 are formed in the insulating substrate 31 at both lateral side regions of the semiconductor light-emitting element 10, that is, at both lateral regions of the recess. The second electrode 33 is provided on a lower surface of the insulating substrate 31 facing the first heat sink 20 and opposite to the first electrode 32 with respect to the semiconductor light-emitting element 10. The second electrode 33 extend to the bottom face of the recess, and is electrically connected to the via electrode 37. The first electrode 32 and the second electrode 33 are insulated from each other.

The third electrode 34 connected to the via electrode 36, and the fourth electrode 35 connected to the via electrode 37 are patterned on the upper surface of the second heat sink 30 which is opposite to the side where the semiconductor element 10 is provided. The third electrode 34 and the fourth electrode 35 are insulated from each other. The insulating substrate 31 is formed of an aluminum nitride (AlN) ceramic, for example. The via electrodes 36, 37 are formed of a metal with a low electric resistance, e.g., Cu, W or Mo. Each of the first electrode 32, the second electrode 33, the third electrode 34, and the fourth electrode 35 is formed of a stacked metal of Ti/Pt/Au, for example.

Now, a method for connecting the semiconductor light-emitting element 10 to the first heat sink 20 and the second heat sink 30 will be described.

First, the semiconductor light-emitting element 10 is attached to the first heat sink 20 with the adhesive layer 41 formed, for example, of AuSn solder and provided on the second conductive film 23 at a central portion of the first heat sink 20. The semiconductor light-emitting element 10 is attached to the second heat sink 30 with the adhesive layer 42 formed, for example, of AuSn solder and provided at the bottom face of the recess. Further, the first heat sink 20 and the second heat sink 30 are attached to each other with the adhesive layers 43, 44 which are respectively provided on a lower surface of the first electrode 32 and a lower surface of the second electrode 33 provided on the second heat sink 30. Each of the adhesive layers 43, 44 can be formed of SnAgCu solder (i.e., an alloy of Sn, Ag and Cu) or AuSn solder, for example.

Fine gold wires 91, 92 are connected to the third electrode 34 and the fourth electrode 35 of the thus-configured semiconductor light-emitting device 1 from the outside to supply electric power to the semiconductor light-emitting element 10 from the outside.

Now, a method for fabricating the semiconductor light-emitting device of the first embodiment will be described with reference to FIG. 2A to FIG. 2F and FIG. 3.

Figure 3:
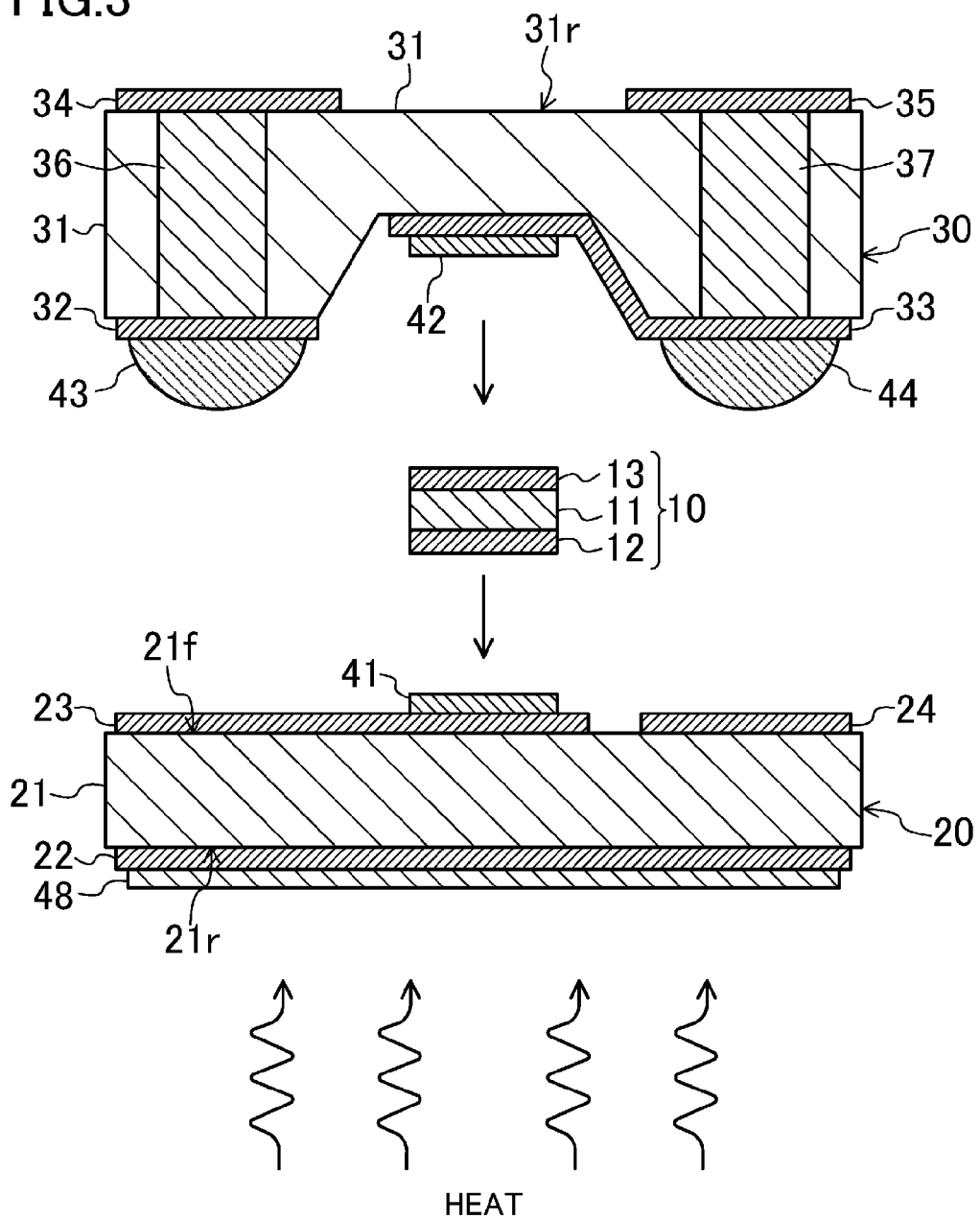
FIG. 3 is a cross-sectional view of the semiconductor light-emitting device of the first embodiment for illustrating a step of the fabrication method.

FIG. 2A to FIG. 2F illustrate a method for fabricating the second heat sink 30. FIG. 3 illustrates a method for adhering the first heat sink 20, the semiconductor light-emitting element 10, and the second heat sink 30.

First, insulating substrates each formed, for example, of an aluminum nitride ceramic are drilled, for example, to form two through holes for each insulating substrate as shown in FIG. 2A. After that, for example, a metal rod of tungsten (W) or molybdenum (Mo) is inserted in each of the through holes and heated, thereby forming two insulating substrates 31a, 31b having via electrodes 36a, 37a and via electrodes 36b, 37b.

Next, for example, a central portion of the insulating substrate 31b is drilled to form an open groove 31g. After that, the surfaces of the insulating substrates 31a, 31b at which the insulating substrates 31a, 31b are connected together are flattened by polishing, for example, and the surfaces are subjected to an activation treatment. After that, the insulating substrate 31a and the insulating substrate 31b are aligned such that the via electrode 36a in the insulating substrate 31a and the via electrode 36b in the insulating substrate 31b are connected together, and that the via electrode 37a in the insulating substrate 31a and the via electrode 37b of the insulating substrate 31b are connected together.

Then, as shown in FIG. 2B, the layered insulating substrates 31a, 31b are heated to obtain the insulating substrate 31 having a recess. The via electrode 36a and the via electrode 36b, and the via electrode 37a and the via electrode 37b are connected together at this time, thereby forming the via electrodes 36, 37. Since the bottom face 31d of the recess is the polished surface of the insulating substrate 31a, the flatness of the bottom face 31d is maintained high. Subsequently, the depth of the recess in the insulating substrate 31 is adjusted. For example, the lower surface of the insulating substrate 31 facing the recess is polished to precisely adjust the distance between first surfaces 31f1, 31f2 and the bottom face 31d of the recess, and flatten the first surfaces 31f1, 31f2.

Next, as shown in FIG. 2C, a third electrode 34 and a fourth electrode 35 each formed of a layered film of Ti/Pt/Au are formed on a second surface 31r of the insulating substrate 31 which is opposite to the first surfaces 31f1, 31f2 by a vacuum vapor deposition method or a sputtering method and a lift-off method such that the third electrode 34 and the fourth electrode 35 are connected to the via electrode 36 and the via electrode 37, respectively.

Next, as shown in FIG. 2D, a first electrode 32 and a second electrode 33 each formed of a layered film of Ti/Pt/Au are formed on the first surfaces 31f1, 31f2 by a vacuum vapor deposition method or a sputtering method and a lift-off method such that the first electrode 32 and the second electrode 33 are connected to the via electrode 36 and the via electrode 37, respectively. The second electrode 33 is patterned such that one end thereof closer to the first electrode 32 reaches the bottom face of the recess. In the present embodiment, the third electrode 34 and the fourth electrode 35 are formed earlier than the first electrode 32 and the second electrode 33, but the first electrode 32 and the second electrode 33 may be formed earlier than the third electrode 34 and the fourth electrode 35. That is, the order of formation of the first electrode 32 and the second electrode 33, and the third electrode 34 and the fourth electrode 35, is not specifically decided.

Next, as shown in FIG. 2E, an adhesive layer 42 formed, for example, of AuSn solder is selectively formed on the second electrode 33 on the bottom face 31d of the recess by a vacuum vapor deposition method or a sputtering method and a lift-off method.

Next, as shown in FIG. 2F, adhesive layers 43, 44 that are bumps formed, for example, of AuSn solder and preferably of SnAgCu solder with a thickness of about 5 μm to about 50 μm, are respectively formed on the lower surface of the first electrode 32 and the lower surface of the second electrode 33 which is opposite to the first surface 31f2 of the insulating substrate 31.

The second heat sink 30 is formed in the above manner.

Subsequently, as shown in FIG. 3, the first heat sink 20, the semiconductor light-emitting element 10, and the second heat sink 30 are electrically and thermally connected together.

First, the insulating substrate 21 formed, for example, of AlN ceramic is polished to a predetermined thickness to fabricate the first heat sink 20. After that, a first conductive film 22 which is a layered film of Ti/Pt/Au, for example, is formed on almost entire second surface 21r that is a lower surface of the insulating substrate 21, by a vacuum vapor deposition method or a sputtering method and a lift-off method. Then, an adhesive layer 48 formed, for example, of AuSn solder is formed on almost entire lower surface of the first conductive film 22 by a vacuum vapor deposition method or a sputtering method and a lift-off method. After that, like the second surface 21r, a second conductive film 23 and a third conductive film 24 each of which is a layered film of Ti/Pt/Au, for example, are patterned on a first surface 21f that is an upper surface of the insulating substrate 21 by a vacuum vapor deposition method or a sputtering method and a lift-off method. As described earlier, the second conductive film 23 and the third conductive film 24 are electrically insulated from each other. Then, an adhesive layer 41 formed, for example, of AuSn solder is selectively formed on a portion of the second conductive film 23 to which the semiconductor light-emitting element 10 is adhered.

The semiconductor light-emitting element 10 includes the stacking semiconductor structure 11 comprised of semiconductor films, such as an n-type buffer layer, an n-type cladding layer, an n-type guide layer, a light-emitting layer, a p-type guide layer, and a p-type cladding layer which are epitaxially grown on the n-type semiconductor substrate by a crystal growth technique, and an optical waveguide is formed in the stacking semiconductor structure 11 in semiconductor process steps. Further, a lower electrode 12 is formed on the p-type cladding layer. An upper electrode 13 is formed on a backside of the n-type semiconductor substrate. The lower electrode 12 and the upper electrode 13 form an ohmic contact with the stacking semiconductor structure 11.

Subsequently, the first heat sink 20, the semiconductor light-emitting element 10, and the second heat sink 30 are sequentially stacked together and positioned on a heater (not shown). After that, the upper surface (the second surface 31r) of the second heat sink 30 is subjected to a predetermined heat treatment using the heater, while applying weight on the upper surface of the second heat sink 30 using a collet, etc. A melting point or a softening temperature of each of the adhesive layers 43, 44 is preferably lower than a melting point or a softening temperature of each of the adhesive layers 41, 42. If the adhesive layers 43, 44 have a lower melting point or a softening temperature than the melting point or the softening temperature of the adhesive layers 41, 42, the adhesive layers 43, 44 are liquefied (softened) faster than the adhesive layers 41, 42 when a temperature increases to join the first heat sink 20, the semiconductor light-emitting element 10, and the second heat sink 30 together. This means that the adhesive layers 43, 44 are cured slowly as the temperature decreases. Therefore, the semiconductor light-emitting element 10, the first heat sink 20, and the second heat sink 30 can be adhered to one another with the adhesive layers 41, 42 which hold the semiconductor light-emitting element 10, by applying a predetermined weight. As a result, a thermal resistance during a contact time can be reduced, and it is therefore possible to efficiently dissipate Joule heat, etc., which is generated in the semiconductor light-emitting element 10.

In the above description, only the heat sinks 20, 30 are individually shown to describe a method for fabricating the first heat sink 20 and the second heat sink 30, but preferably, the semiconductor light-emitting devices 1 are collectively formed using a wafer on which the heat sinks 20, 30 are arranged in a matrix, and the wafer is thereafter cut into individual semiconductor light-emitting devices 1 by dicing, etc. Specifically, in forming the insulating substrate 31b shown in FIG. 2A, it is preferable that a duckboard-shaped wafer in which the outer boundary is physically connected to an outer frame, etc., and open grooves 31g are formed in the respective central portions, is used to form the second heat sinks 30, and that the wafer is thereafter cut into individual second heat sinks 30 by dicing, etc.

Now, a semiconductor light-emitting device 80 of the first embodiment will be described with reference to FIG. 4.

Figure 4:
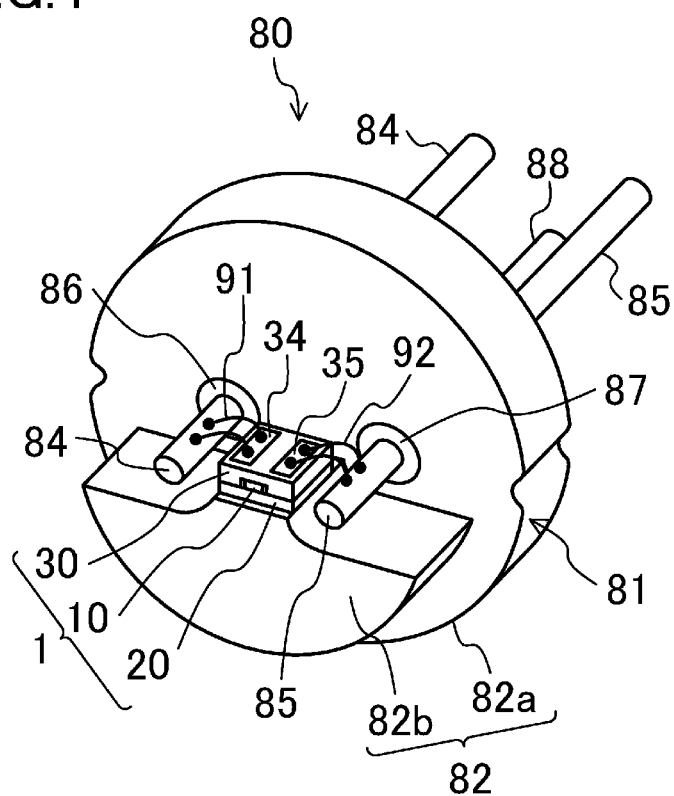
FIG. 4 is an oblique view of the semiconductor light-emitting device of the first embodiment which is mounted on a CAN type package.

As shown in FIG. 4, the semiconductor light-emitting device 80 of the present embodiment has a structure in which the semiconductor light-emitting device 1 of the present embodiment is mounted on a so-called CAN type package 81.

The package 81 is comprised of a base 82 which includes a disc-like base body 82a formed of copper (Cu) or iron (Fe), and a post 82b to the principal surface of which the semiconductor light-emitting device 1 is adhered in a vertical direction.

The base body 82a is provided with a lead pin 84 for anode, a lead pin 85 for cathode, and a lead pin 88 for ground, such that they penetrate the principal surface and the back surface of the base body 82a. The lead pins 84, 85 are electrically insulated from each other by insulating portions 86, 87 made of insulating materials, such as glass, respectively, and firmly held on the base body 82a.

In a package 81 having the above configuration, the semiconductor light-emitting device 1 is adhered to the upper surface of the post 82b such that the first heat sink 20 and the post 82b are in contact with each other. The third electrode 34 and the fourth electrode 35 formed on the upper surface of the second heat sink 30 are electrically connected to the lead pin 84 and the lead pin 85, respectively, by fine gold wires 91, 92. In this configuration, the electric power supplied through the lead pins 84, 85 is converted into light by the semiconductor light-emitting element 10, and the light is emitted in a forward direction of the drawing.

In the present embodiment, a cap with a glass window for air-tightly encapsulating the semiconductor light-emitting element 10 is not shown, but it is possible to provide such a cap according to the necessity of the semiconductor light-emitting device 80.

Now, a method for fabricating the semiconductor light-emitting device 80 of the present embodiment will be described with reference to FIG. 5A to FIG. 5C.

First, as shown in FIG. 5A, the first heat sink 20, the semiconductor light-emitting element 10, and the second heat sink 30 comprising the semiconductor light-emitting device 1 are sequentially mounted on a mounting surface 82c of the post 82b of the package 81. The base body 82a of the package 81 is held by a collet (not shown) or the like at the time of the mounting of these components, such that the mounting surface 82c of the post 82b faces upward.

Next, as shown in FIG. 5B, the package 81 with the components of the semiconductor light-emitting device 1 is heated by a heater (not shown). As a result, the first heat sink 20, the semiconductor light-emitting element 10, and the second heat sink 30 are adhered together on the mounting surface 82c of the post 82b, thereby obtaining the semiconductor light-emitting device 1.

Next, as shown in FIG. 5C, the lead pins 84, 85 of the package 81 and the semiconductor light-emitting device 1 are electrically connected together by the fine gold wires 91, 92.

Now, operation of the semiconductor light-emitting device 80 of the present embodiment will be described with reference to FIG. 6.

Figure 6:
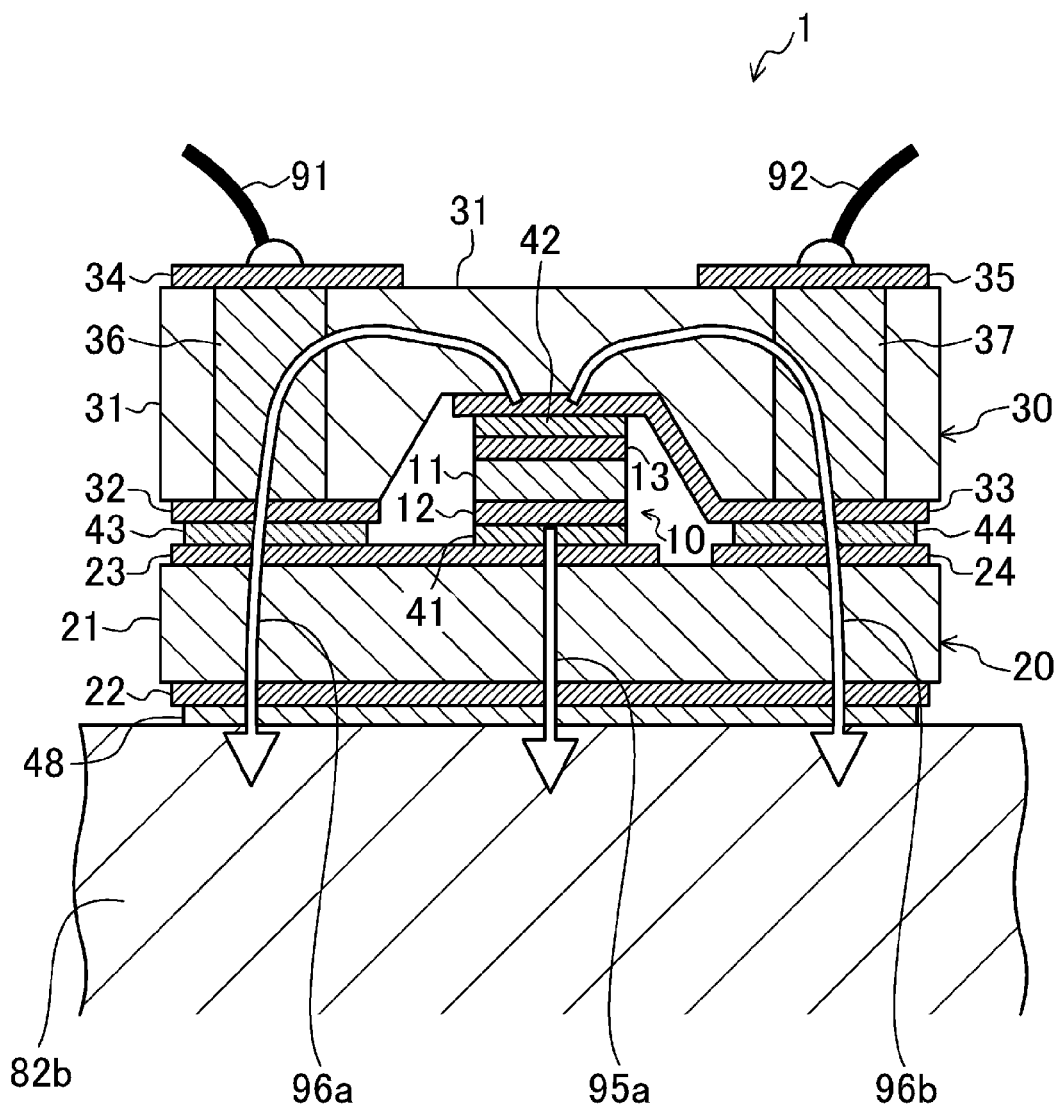
FIG. 6 is schematic cross-sectional view illustrating a heat flow during operation of the semiconductor light-emitting device of the first embodiment.

In the semiconductor light-emitting device 80, as shown in FIG. 6, a current applied from the lead pin 84 for anode is transmitted to the third electrode 34, the via electrode 36, the adhesive layer 43, the second conductive film 23, and the adhesive layer 41 through the fine gold wire 91, and applied to the semiconductor light-emitting element 10. The current applied to the semiconductor light-emitting element 10 is transmitted to the adhesive layer 42, the second electrode 33, the via electrode 37, and the fourth electrode 35, and flows to the lead pin 85 for cathode through the fine gold wire 92. Part of the electric power applied to the semiconductor light-emitting element 10 is converted into light, which is emitted to the outside from the semiconductor light-emitting device 80

The rest of the electric power having been applied to the semiconductor light-emitting element 10 but not converted into light is transformed into Joule heat. Part of the Joule heat generated in the semiconductor light-emitting element 10 is transmitted to the first heat sink 20 through a first heat dissipation path 95a, and is dissipated to the outside, e.g., to the post 82b. On the other hand, heat transmitted to the second heat sink 30 is transmitted from the adhesive layers 43, 44 to the first heat sink 20 through second heat dissipation paths 96a, 96b, and is efficiently dissipated to the outside, e.g., to the post 82b.

The semiconductor light-emitting element 10 held in the semiconductor light-emitting device 1 is thermally connected to the first heat sink 20 and the second heat sink 30 at the upper and lower surfaces, i.e., the largest surface areas of the semiconductor light-emitting element 10. Thus, the Joule heat generated in the semiconductor light-emitting element 10 can be efficiently dissipated to the outside of the semiconductor light-emitting element 10. As a result, it is possible to reduce the deterioration of the operational properties of the semiconductor light-emitting device 80 due to a temperature increase of the semiconductor light-emitting element 10.

The first heat sink 20 and the second heat sink 30 connected to the semiconductor light-emitting element 10 are thermally connected to a material, e.g., AlN ceramic, whose thermal expansion coefficient is close to a thermal expansion coefficient of the semiconductor light-emitting element 10, with the conductive films 22, 23, 24 which are metal films having a thin thickness interposed therebetween. Thus, when the semiconductor light-emitting device 1 is fabricated, e.g., when the semiconductor light-emitting element 10, and the first heat sink 20 and the second heat sink 30 are joined together by applying a weight and heat, or when the semiconductor light-emitting device 1 is in operation and generating heat, stress is applied to the semiconductor light-emitting element 10 due to an increase in temperature of an area near the semiconductor light-emitting element 10. The stress can prevent the deterioration of the operational properties of the semiconductor light-emitting device 1, and a decrease in the long-term reliability of the semiconductor light-emitting device 1.

In the case of FIG. 6 where the semiconductor light-emitting device 80 is fabricated using the semiconductor light-emitting device 1 mounted on the package 81, the Joule heat generated in the semiconductor light-emitting element 10 is dissipated to an external attachment jig by way of the post 82b and the base body 82a through the heat dissipation paths 95a, 96a, and 96b.

Now, the current-optical output properties and the current-voltage properties of the semiconductor light-emitting device of the present embodiment will be described with reference to FIG. 7A and FIG. 7B.

Figure 7A:
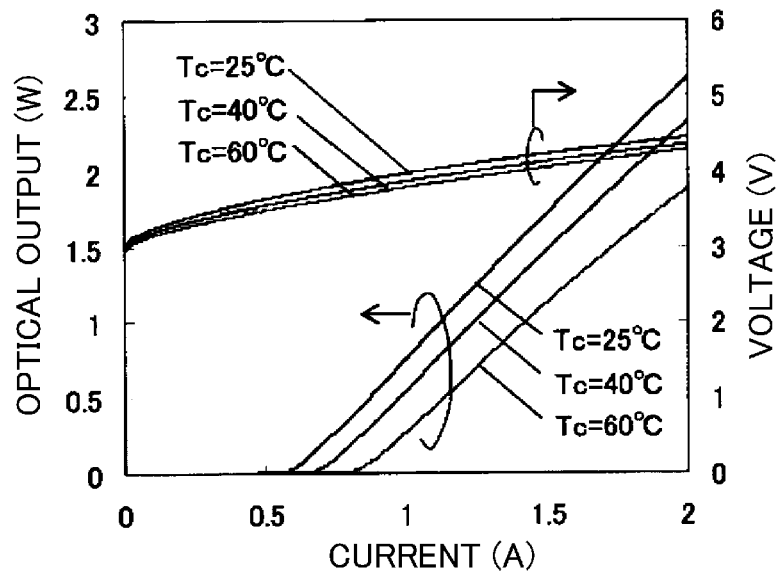
FIG. 7A is a graph showing current-optical output properties and current-voltage properties of the semiconductor light-emitting device of the first embodiment.

FIG. 7A shows the current-optical output properties and the current-voltage properties of the semiconductor light-emitting device of the present embodiment at the time when the base temperature Tc is 25° C., 40° C. and 60° C. FIG. 7B shows the current-optical output properties and the current-voltage properties of a semiconductor light-emitting device of a reference example under the conditions equivalent to those of the present embodiment.

The semiconductor light-emitting element 10 was fabricated using a (In, Al, Ga, N) base compound semiconductor. The semiconductor light-emitting device of the reference example has a configuration in which the second heat sink 30 included in the semiconductor light-emitting device 1 of the present embodiment shown in FIG. 1 is not provided, that is, a configuration in which the first heat sink 20 is adhered to the post 82b of the semiconductor light-emitting device 80 shown in FIG. 4, with only the semiconductor light-emitting element 10 adhered onto the first heat sink 20. The lead pin 84 for anode is connected to the second conductive film 23 by the fine gold wire 91. The lead pin 85 for cathode is connected to the upper electrode 13 of the semiconductor light-emitting element 10 by the fine gold wire 92. Thus, the semiconductor light-emitting device of the reference example and the semiconductor light-emitting device 80 of the present embodiment can be compared with each other, based on the same package 81 and the same lead pins 84, 85.

First, thermal resistances are compared between the semiconductor light-emitting device of the present embodiment and the semiconductor light-emitting device of the reference example. The results showed that the thermal resistance of the semiconductor light-emitting device of the reference example was 10 K/W and the thermal resistance of the semiconductor light-emitting device of the present embodiment was 6 K/W. This means that the configuration of the semiconductor light-emitting device of the present embodiment can reduce the thermal resistance by 40%.

Figure 7B:
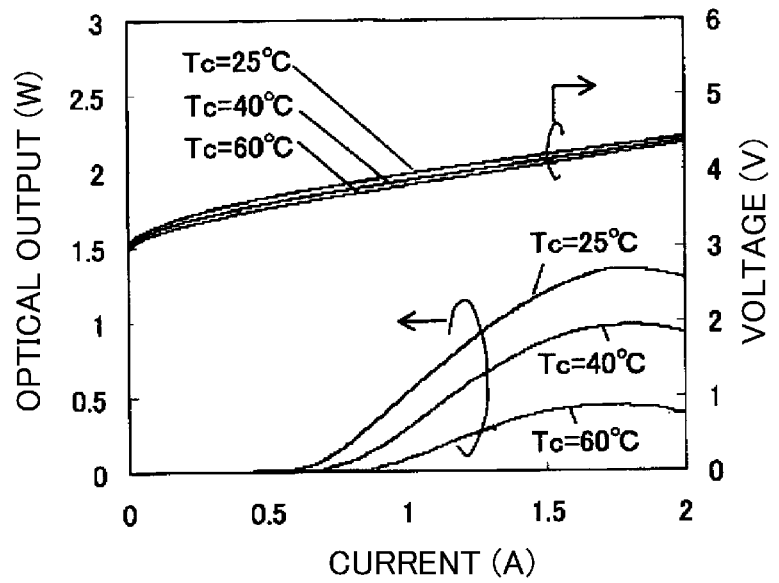
FIG. 7B is a graph showing current-optical output properties and current-voltage properties of a semiconductor light-emitting device of a reference example.

Further, the comparison between the current-optical output properties shown in FIG. 7A and FIG. 7B shows that using the semiconductor light-emitting device 80 of the present embodiment enables easier improvement in thermal saturation level of the current-optical output properties, and implementation of higher output, even when the same semiconductor light-emitting element 10 as that of the semiconductor light-emitting device of the reference example is used. Moreover, the comparison between the current-voltage properties shows that the provision of the second heat sink 30 of the present embodiment does not lead to an increase in series resistance, and therefore does not deteriorate the current-voltage properties.

(First Variation of First Embodiment)

Figure 8:
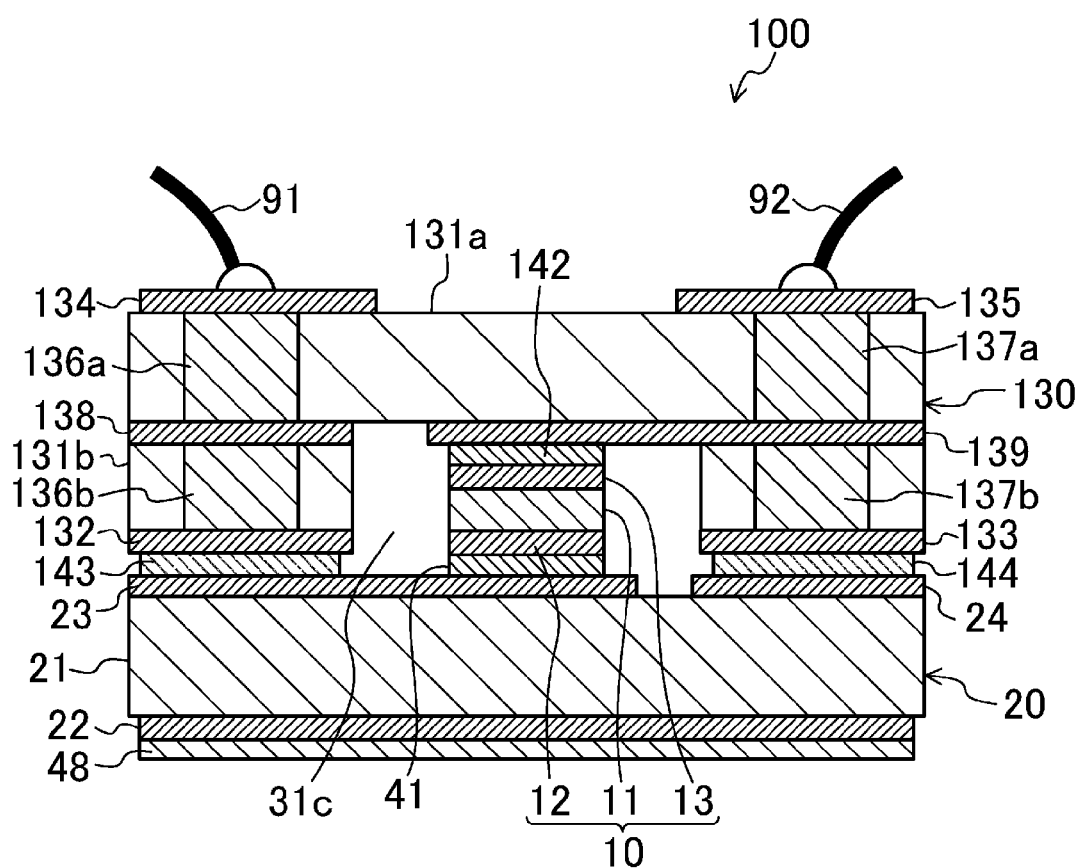
FIG. 8 is a cross-sectional view of a semiconductor light-emitting device of the first variation of the first embodiment.

A semiconductor light-emitting device of the first variation of the first embodiment will be described below with reference to FIG. 8. As shown in FIG. 8, the configuration and the fabrication method of a second heat sink 130 of a semiconductor light-emitting device 100 of the present variation are different from those of the semiconductor light-emitting device 1 of the first embodiment. The configuration and method which differ from those of the semiconductor light-emitting device 1 will be described here.

In FIG. 8, the second heat sink 130 of the present variation is comprised of an insulating substrate 131*a* and an insulating substrate 131*b* which are adhered to each other by intermediate electrodes (joint layers) 138, 139. The insulating substrate 131*a* has via electrodes 136*a*, 137*a* which penetrate the insulating substrate 131*a* in a front and back surface direction. The insulating substrate 131*b* has via electrodes 136*b*, 137*b* which penetrate the insulating substrate 131*b* in the front and back surface direction.

The insulating substrate 131*b* is provided, at a central portion thereof, with a groove portion to serve as a cavity 31*c* where a semiconductor light-emitting element 10 is placed. Part of the intermediate electrode 139 is exposed from a bottom face of the groove portion. An adhesive layer 142 formed, for example, of AuSn solder is patterned on the part of the intermediate electrode 139 exposed from the bottom face of the groove portion, and the adhesive layer 142 is adhered to an upper electrode 13 of the semiconductor light-emitting element 10.

The via electrode 136*a* and the via electrode 136*b* are electrically connected to each other by the intermediate electrode 138. Similarly, the via electrode 137*a* and the via electrode 137*b* are electrically connected to each other by the intermediate electrode 139.

A third electrode 134 and a fourth electrode 135 insulated from each other are provided on the upper surface of the insulating substrate 131*a* of the second heat sink 130. The third electrode 134 and the fourth electrode 135 are connected to the via electrodes 136*a*, 137*a*, respectively. On the other hand, a first electrode 132 and a second electrode 133 insulated from each other are provided on the lower surface of the insulating substrate 131*b* of the second heat sink 130. The first electrode 132 and the second electrode 133 are connected to the via electrodes 136*b*, 137*b*, respectively.

In the semiconductor light-emitting device 100, the third electrode 134 and the fourth electrode 135 are electrically connected to lead pins by the fine gold wires 91, 92, similarly to the first embodiment. A current applied from the outside is transmitted to the third electrode 134, the via electrodes 136*a*, 136*b*, the adhesive layer 143, the second conductive film 23, and the adhesive layer 41, and applied to the semiconductor light-emitting element 10. The current applied to the semiconductor light-emitting element 10 flows to the adhesive layer 142, the intermediate electrode 139, the via electrode 137*a*, the fourth electrode 135, and the fine gold wire 92. Part of electric power applied to the semiconductor light-emitting element 10 is converted into light, which is emitted to the outside from the semiconductor light-emitting device 100.

On the other hand, the Joule heat generated in the semiconductor light-emitting element 10 is efficiently dissipated from both of the first heat sink 20 and the second heat sink 130, similarly to the first embodiment. It is therefore possible to reduce an increase in temperature of the semiconductor light-emitting device 100 due to the heat generated in the semiconductor light-emitting element 10. As a result, it is possible to improve optical output of the semiconductor light-emitting element 10 and long-term reliability of the semiconductor light-emitting element 10.

Now, a method or fabricating the semiconductor light-emitting device of the first variation will be described with reference to FIG. 9A to FIG. 9E.

Similarly to the first embodiment, the heat sinks are individually shown in the present variation, but preferably, the heat sinks are collectively formed using a wafer on which a plurality of heat sinks are arranged in a matrix, and the wafer is thereafter cut into individual heat sinks by dicing, etc. This is also applied to the other variations described below.

First, as shown in FIG. 9A, the insulating substrate 131*a* in which the via electrodes 136*a*, 137*a* are formed, and the insulating substrate 131*b* in which the via electrodes 136*b*, 137*b* are formed are prepared. Contact surfaces of the insulating substrate 131*a* and the insulating substrate 131*b* are flattened by polishing, etc. After that, for example, a layered metal of Ti/Pt/Au/AuSn, etc., is patterned by a vacuum vapor deposition method and a lift-off method, etc., thereby forming intermediate electrodes 138*a*, 138*b*, 139*a* and 139*b* to serve as joint layers. An open groove 131*g* which serves as a cavity is formed in a central portion of the insulating substrate 131*b* at this time. In the wafer described above, the insulating substrate 131*b* is connected to the outer frame at the boundary of the insulating substrate 131*b*.

Next, as shown in FIG. 9B, the intermediate electrodes 138*a* and 138*b*, and the intermediate electrodes 139*a* and 139*b* are aligned with each other. Then, the insulating substrate 131*a* and the insulating substrate 131*b* are heated while applying weight to the insulating substrate 131*a* and the insulating substrate 131*b*, thereby joining the insulating substrate 131*a* and the insulating substrate 131*b* together and forming the intermediate electrodes 138, 139. Here, part of the intermediate electrode 139 is exposed from the open groove 131*g*.

Next, as shown in FIG. 9C, the upper surface of the joined insulating substrate 131*a* is polished. Then, the third electrode 134 and the fourth electrode 135 are patterned on the upper surface of the polished insulating substrate 131*a* such that they are aligned with the via electrodes 136*a* and 137*a*, respectively. The back surface of the insulating substrate 131*b* is polished to adjust the thickness of the insulating substrate 131*b* with high precision. After that, the first electrode 132 and the second electrode 133 are formed on the polished back surface of the insulating substrate 131*b*.

Next, as shown in FIG. 9D, the adhesive layer 142 formed, for example, of AuSn solder is patterned on the intermediate electrode 139 exposed from the open groove 131*g*. Similarly, the adhesive layers 143, 144 that are bumps formed, for example, of AuSn solder are formed on the first electrode 132 and the second electrode 133, respectively.

Next, as shown in FIG. 9E, the semiconductor light-emitting element 10 is sandwiched between the first heat sink 20 and the second heat sink 130 in the open groove 131*g*, thereby electrically and thermally connecting the semiconductor light-emitting element 10, the first heat sink 20, and the second heat sink 130 together, similarly to the first embodiment. Specifically, the adhesive layer 143 of the second heat sink 130 is adhered to the second conductive film 23 of the first heat sink 20, and the adhesive layer 144 of the second heat sink 130 is adhered to the third conductive film 24 of the first heat sink 20. Further, the adhesive layer 142 of the second heat sink 130 is adhered to the upper electrode 13 of the semiconductor light-emitting element 10, and the adhesive layer 41 of the first heat sink 20 is adhered to the lower electrode 12 of the semiconductor light-emitting element 10.

Due to these steps, it is possible to fabricate the semiconductor light-emitting device 100 with improved dissipation of heat, such as Joule heat generated in the semiconductor light-emitting element 10.

(Second Variation of First Embodiment)

A semiconductor light-emitting device of the second variation of the first embodiment will be described with reference to FIG. 10.

Figure 10:
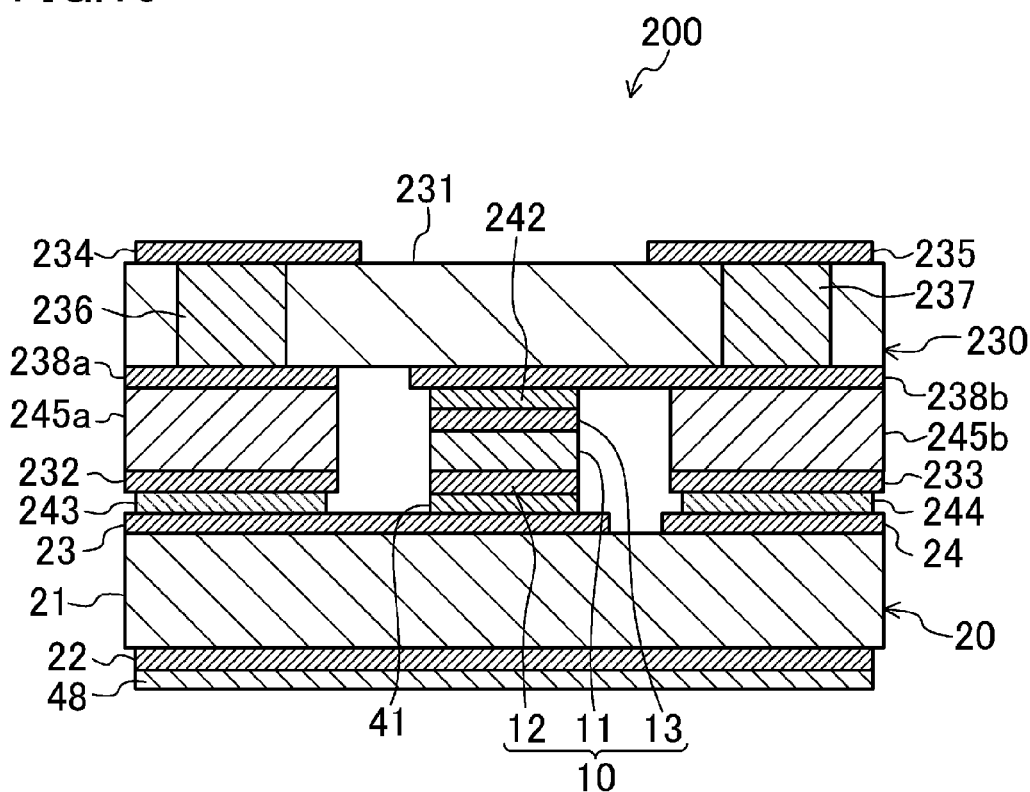
FIG. 10 is a cross-sectional view of a semiconductor light-emitting device of the second variation of the first embodiment.

As shown in FIG. 10, the configuration and the fabrication method of a second heat sink 230 of a semiconductor light-emitting device 200 of the present variation are different from those of the semiconductor light-emitting device 1 of the first embodiment. The configuration and method which differ from those of the semiconductor light-emitting device 1 will be described here.

In FIG. 10, the second heat sink 230 of the present variation is configured such that a third electrode 234 and a fourth electrode 235 are formed on the upper surface of the insulating substrate 231 in which the via electrodes 236, 237 are formed. The third electrode 234 and the fourth electrode 235 are connected to the via electrodes 236, 237, respectively. Underlying electrodes 238a, 238b are formed on the lower surface of the insulating substrate 231. One of the ends of the underlying electrode 238b which is closer to the underlying electrode 238a extends to a central portion of the insulating substrate 231.

Electroformed portions 245a, 245b, which are Cu bumps, for example, are provided on the lower surfaces of the underlying electrodes 238a, 238b in regions under the via electrodes 236, 237. The electroformed portions are conductive members formed by an electroforming method. A first electrode 232 and a second electrode 233 each formed by layering Ti/Pt/Au, for example, are formed on the respective lower surfaces of the electroformed portions 245a, 245b. For example, the first electrode 232 and the second electrode 233 of the second heat sink 230 are connected to the second conductive film 23 and the third conductive film 24 of the first heat sink 20 by the adhesive layers 243, 244 formed of AuSn solder, respectively.

Now, a method for fabricating the semiconductor light-emitting device of the second variation will be described with reference to FIG. 11A to FIG. 11E.

Figure 11:
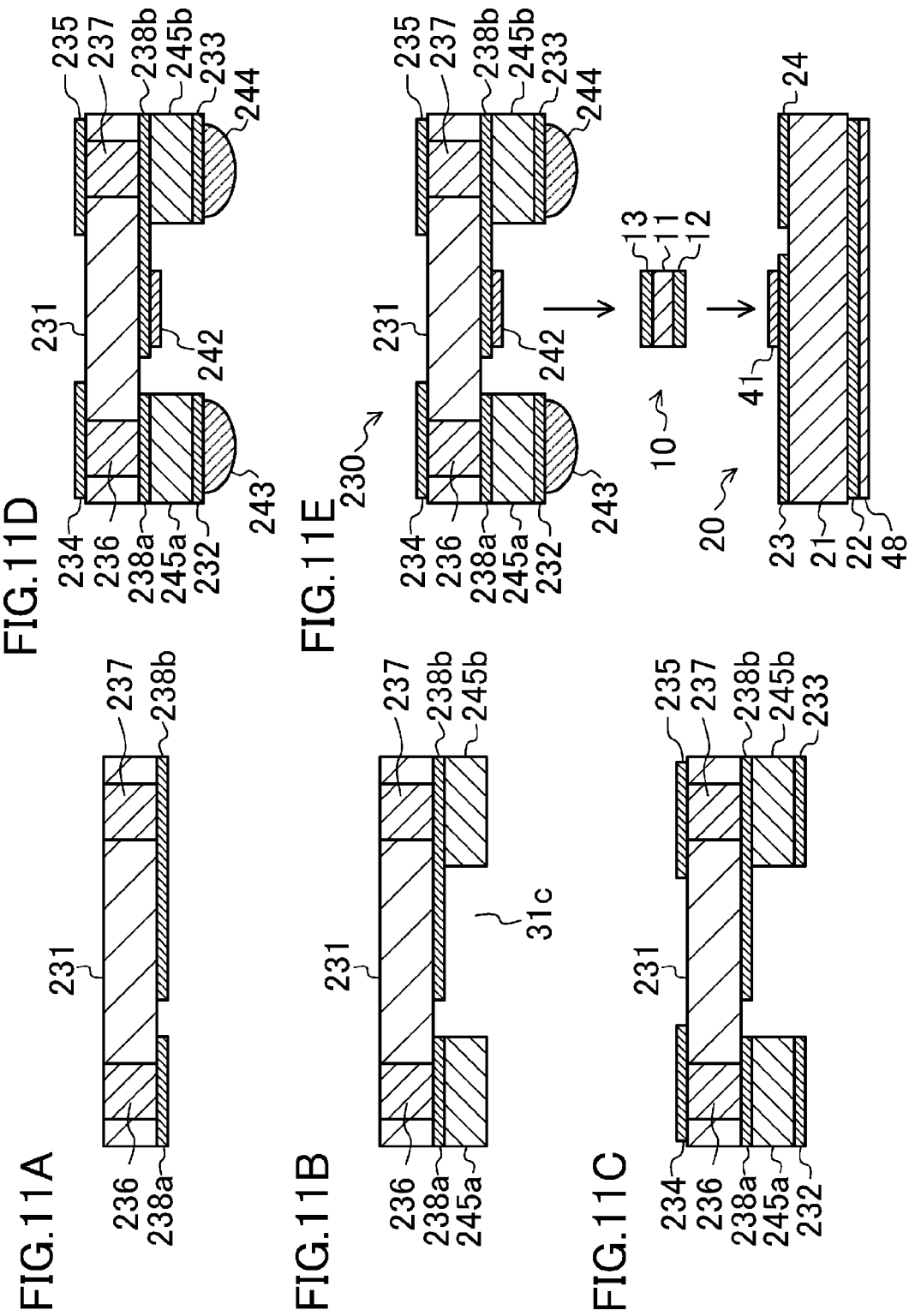
FIG. 11A to FIG. 11E show cross-sectional views of the semiconductor light-emitting device of the second variation of the first embodiment in the order of steps of a fabrication method.

First, as shown in FIG. 11A, via electrodes 236, 237 are formed in the insulating substrate 231 formed, for example, of AlN ceramic such that they penetrate the insulating substrate 231 in the front and back surface direction at predetermined locations thereof. One of the surfaces (e.g., a lower surface) of the insulating substrate 231 having the via electrodes 236, 237 is provided with underlying electrodes 238a, 238b to which the via electrode 236, 237 are electrically connected respectively.

Next, as shown in FIG. 11B, a resist mask is formed on the lower surfaces of the underlying electrodes 238a, 238b by lithography. After that, the lower surfaces are selectively plated with copper (Cu) by an electroforming method, thereby forming the electroformed portions 245a, 245b, which are Cu bumps, under the via electrodes 236, 237, respectively, and a cavity 31c. The lower surfaces of the obtained electroformed portions 245a, 245b are polished to adjust the heights of the electroformed portions 245a, 245b with high precision, and improve flatness of the lower surfaces.

Next, as shown in FIG. 11C, the first electrode 232 and the second electrode 233 each formed of a metal layered film of Ti/Pt/Au, for example, are formed on the lower surfaces of the electroformed portions 245a, 245b, respectively, by a vacuum vapor deposition method and a lift-off method. Similarly, a third electrode 234 and a fourth electrode 235 each formed of a layered metal of Ti/Pt/Au, for example, are formed on the upper surface of the insulating substrate 231 by a vacuum vapor deposition method and a lift-off method. The order of steps for forming the first electrode 232 and the second electrode 233, and the third electrode 234 and the fourth electrode 235 is not specifically decided.

Next, as shown in FIG. 11D, an adhesive layer 242 formed, for example, of AuSn solder to which the upper electrode 13 of the semiconductor light-emitting element 10 is adhered, is patterned at a region of the underlying electrode 238b exposed between the electroformed portions 245a, 245b. Further, adhesive layers 243, 244 that are bumps formed, for example, of AuSn solder are formed on the lower surfaces of the first electrode 232 and the second electrode 233, respectively.

Next, as shown in FIG. 11E, the semiconductor light-emitting element 10 is sandwiched between the first heat sink 20 and the second heat sink 230 and located in a region between the electroformed portions 245a and 245b, thereby electrically and thermally connecting the semiconductor light-emitting element 10, the first heat sink 20, and the second heat sink 230 together, similarly to the first embodiment, to form the semiconductor light-emitting device 200.

As described above, in the second variation, the second heat sink 230 can have a recessed portion without using a bonding technique. It is therefore possible to fabricate the semiconductor light-emitting device 200 at low cost.

(Third Variation of First Embodiment)

A semiconductor light-emitting device of the third variation of the first embodiment will be described with reference to FIG. 12.

Figure 12:
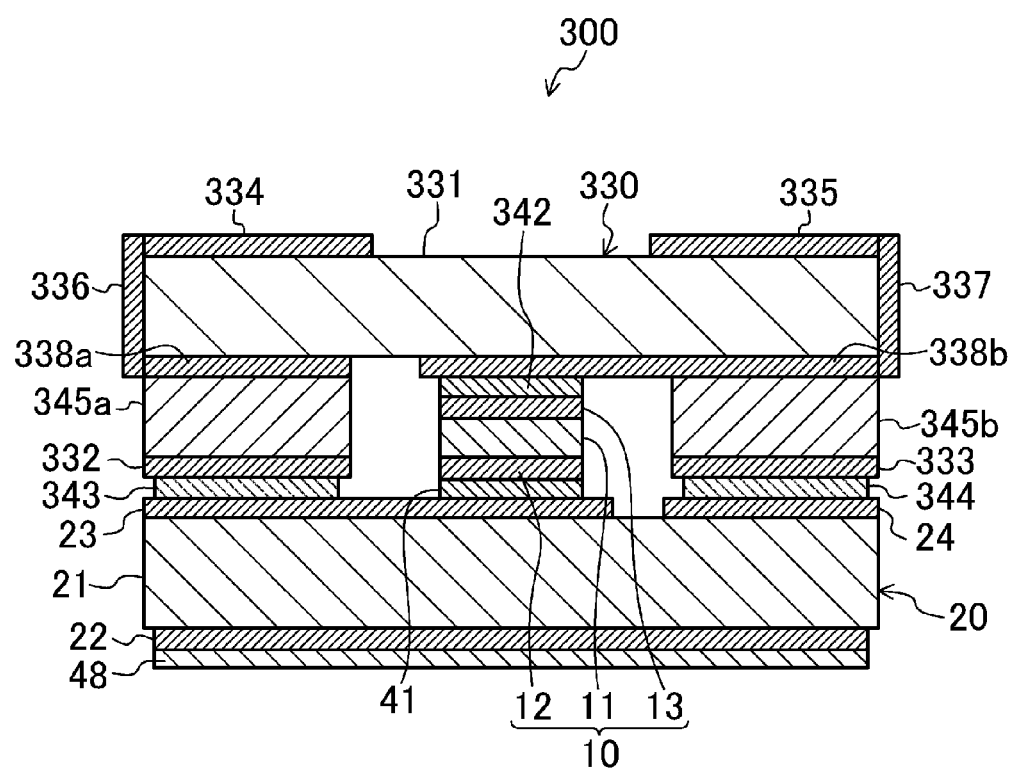
FIG. 12 is a cross-sectional view of a semiconductor light-emitting device of the third variation of the first embodiment.

As shown in FIG. 12, the configuration and the fabrication method of a second heat sink 330 of a semiconductor light-emitting device 300 of the present variation are different from those of the semiconductor light-emitting device 1 of the first embodiment. The configuration and method which differ from those of the semiconductor light-emitting device 1 will be described here.

In FIG. 12, the second heat sink 330 is configured such that a third electrode 334 and a fourth electrode 335 are formed on the upper surface of the insulating substrate 331 formed, for example, of AlN ceramic, and such that underlying electrodes 338a, 338b are formed on the lower surface of the insulating substrate 331. Further, side surface interconnects 336, 337 are formed on the side surfaces of the insulating substrate 331 facing each other. The third electrode 334 and the underlying electrode 338a are electrically connected to each other by the side surface interconnect 336. The fourth electrode 335 and the underlying electrode 338b are electrically connected to each other by the side surface interconnect 337. One of the ends of the underlying electrode 338b which is closer to the underlying electrode 338a extends to a central portion of the insulating substrate 331.

Electroformed portions 345*a*, 345*b* that are Cu bumps, for example, are formed on the lower surfaces of the underlying electrodes 338*a*, 338*b*. A first electrode 332 and a second electrode 333 each formed of a layered metal of Ti/Pt/Au, for example, are formed on the lower surfaces of the electroformed portions 345*a*, 345*b*, respectively. Adhesive layers 343, 344 formed, for example, of AuSn solder are provided on the lower surfaces of the first electrode 332 and the second electrode 333, respectively. The first electrode 332 and the second electrode 333 are electrically and thermally connected to the first heat sink 20 by the adhesive layers 343, 344.

Now, a method for fabricating the semiconductor light-emitting device of the third variation will be described with reference to FIG. 13A to FIG. 13E.

Figure 13:
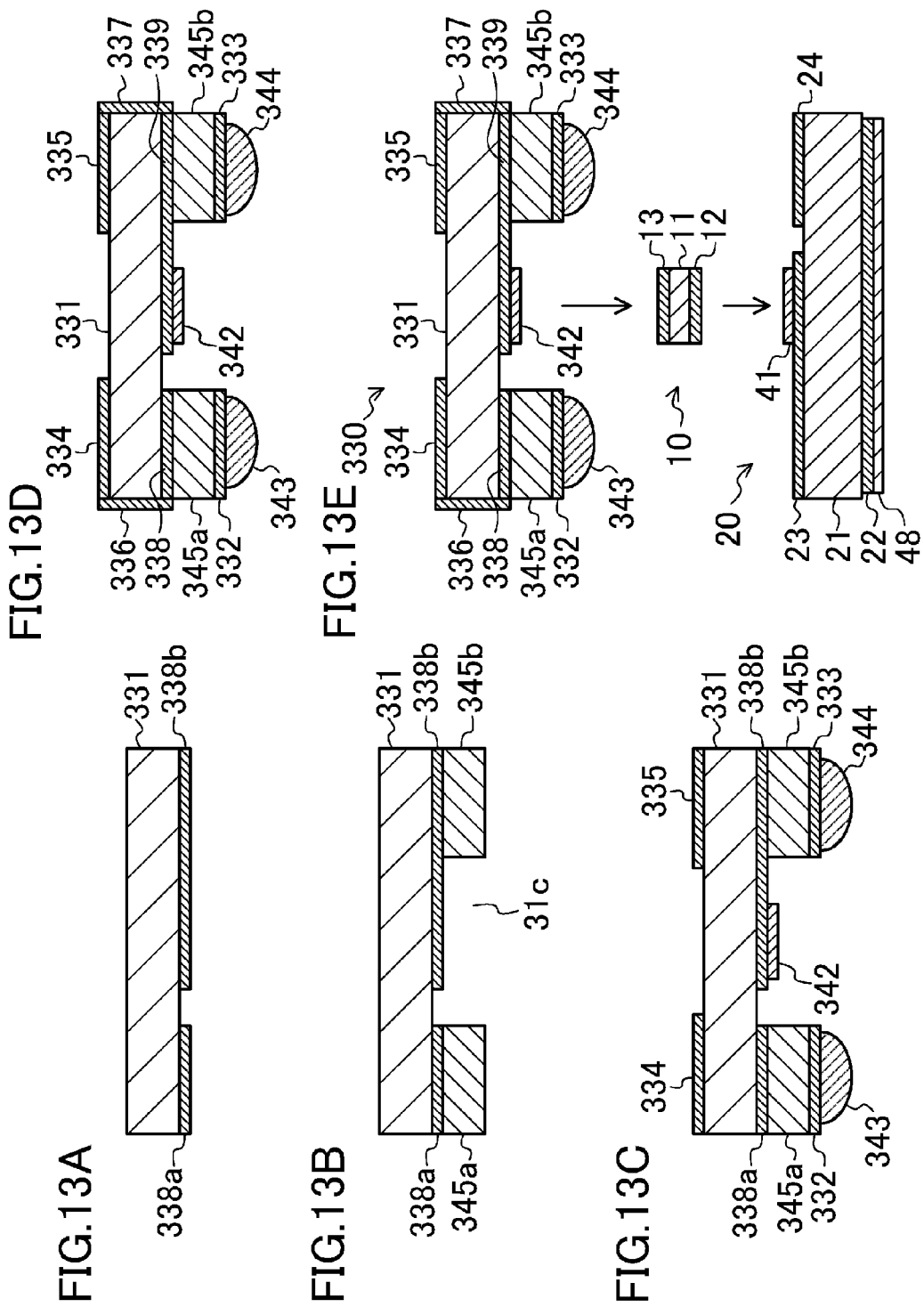
FIG. 13A to FIG. 13E show cross-sectional views of the semiconductor light-emitting device of the third variation of the first embodiment in the order of steps of a fabrication method.

First, as shown in FIG. 13A, the underlying electrodes 338*a*, 338*b* are patterned on the lower surface, i.e., the surface facing the semiconductor element, of the insulating substrate 331 formed, for example, of AlN ceramic.

Next, as shown in FIG. 13B, the lower surfaces of the underlying electrodes 338*a*, 338*b* are selectively plated with copper (Cu) similarly to the second variation, thereby forming the electroformed portions 345*a*, 345*b*, which are Cu bumps, with a cavity 31*c* between the electroformed portions 345*a*, 345*b*. Next, the lower surface of the obtained electroformed portions 345*a*, 345*b* are polished to adjust the heights of the electroformed portions 345*a*, 345*b* with high precision, and improve flatness of the lower surfaces.

Next, as shown in FIG. 13C, the third electrode 334 and the fourth electrode 335 each formed of a layered metal of Ti/Pt/Au, for example, are formed on the upper surface of the insulating substrate 331 by a vacuum vapor deposition method and a lift-off method. Similarly, the first electrode 332 and the second electrode 333 each formed of a metal layered film of Ti/Pt/Au, for example, are then formed on the lower surfaces of the electroformed portions 345*a* and 345*b*, respectively, by a vacuum vapor deposition method and a lift-off method. In this method, as well, the order of steps for forming the third electrode 334 and the fourth electrode 335, and the first electrode 332 and the second electrode 333 is not specifically decided. Then, an adhesive layer 342 formed, for example, of AuSn solder to which the upper electrode 13 of the semiconductor light-emitting element 10 is adhered, is patterned at a region of the underlying electrode 338*b* exposed between the electroformed portions 345*a* and 345*b*. Next, adhesive layers 343, 344 that are bumps formed, for example, of AuSn solder are formed on the lower surfaces of the first electrode 332 and the second electrode 333, respectively.

Next, as shown in FIG. 13D, the insulating substrates 331 in the form of wafer are divided into pieces by dicing, etc. After that, side surface interconnects 336, 337 are formed on the side surfaces of the insulating substrate 331 in the form of chip, by plating.

Next, as shown in FIG. 13E, the semiconductor light-emitting element 10 is sandwiched between the first heat sink 20 and the second heat sink 330 and located in a region between the electroformed portions 345*a* and 345*b*, thereby electrically and thermally connecting the semiconductor light-emitting element 10, the first heat sink 20, and the second heat sink 330 together, similarly to the first embodiment, to form the semiconductor light-emitting device 300.

As described above, in the third variation, the second heat sink 330 is configured such that the upper and lower surfaces thereof can be electrically conductive without providing a via electrode. It is therefore possible to fabricate the semiconductor light-emitting device 300 at low cost.

(Fourth Variation of First Embodiment)

A semiconductor light-emitting device of the fourth variation of the first embodiment will be described with reference to FIG. 14.

Figure 14:
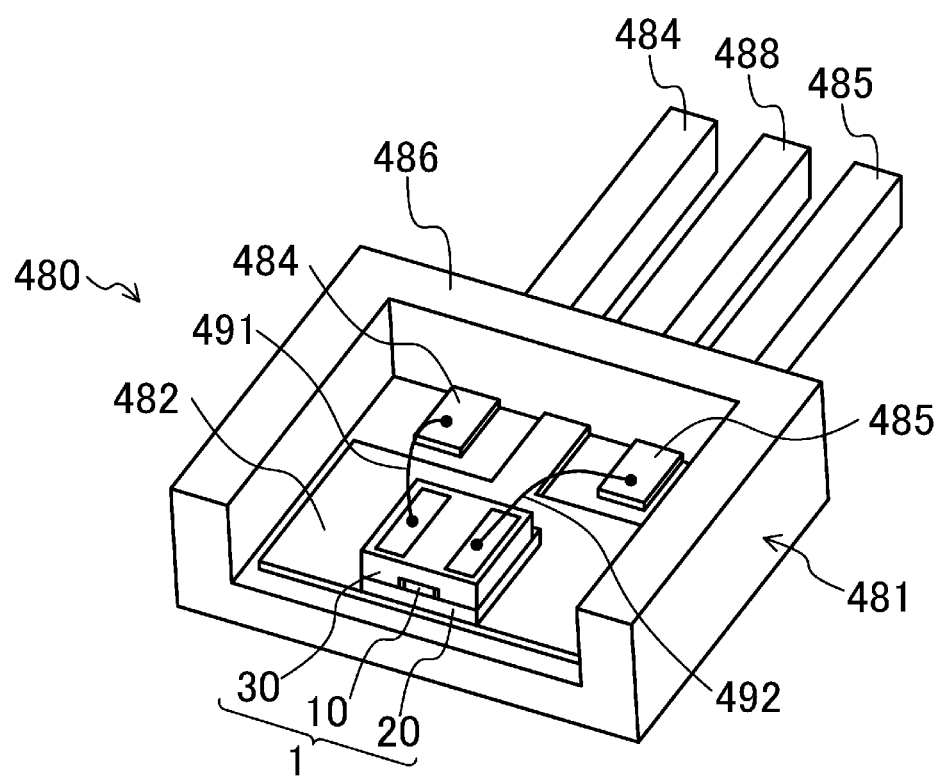
FIG. 14 is a cross-sectional view of the semiconductor light-emitting device of the fourth variation of the first embodiment.

As shown in FIG. 14, a semiconductor light-emitting device 480 of the fourth variation is configured such that the semiconductor light-emitting device 1 of the first embodiment is mounted on a package 481 having a configuration different from that of the package 81 shown in FIG. 4.

In FIG. 14, the package 481 comprising the semiconductor light-emitting device 480 has a structure with a thin thickness which is generally called a frame type. The package 481 is configured such that a base body 482 formed, for example, of copper (Cu), a lead pin 488 for ground, a lead pin 484 for anode, and a lead pin 485 for cathode are held on an insulating resin portion 486 formed, for example, of polypropylene. The base body 482 is formed of a plate-like metal such as copper. The width of part of the base body 482 is as narrow as the width of each of the leads 484, 485, thereby forming a reduced-width portion that functions as the lead pin 488 for ground. Each of the lead pins 484, 485 is insulated from the base body 482. The insulating resin portion 486 is configured to surround the base body 482. Specifically, the base body 482 is configured such that part of each of the side on which the semiconductor light-emitting device 1 is placed (the front surface side) and the side opposite to the front surface side (the back surface side) is exposed, and an external jig (not shown) is disposed so as to be in contact with the exposed back surface side.

The semiconductor light-emitting device 1 and the lead pins 484, 485 are electrically connected together by fine gold wires 491, 492. In this configuration, electric power is converted into light, which is emitted in a forward direction of FIG. 14. Further, similarly to the first embodiment, the Joule heat generated in the semiconductor light-emitting device 1 is transmitted to the base body 482 and thereafter to the external jig disposed on the back surface of the base body 482. It is therefore possible to reduce a temperature increase of the semiconductor light-emitting element 10 sandwiched between the first heat sink 20 and the second heat sink 30.

As described above, the semiconductor light-emitting device 480 of the fourth variation is configured such that heat generated in the semiconductor light-emitting device 1 can be transmitted directly to the base body 482 without providing a post therebetween. It is therefore possible to further increase the heat dissipation properties.

Further, it is not necessary to provide a lead pin necessary for electric interconnect directly under the base body 482, and therefore, the entire back surface of the base body 482 can be thermally connected to the external jig. It is therefore possible to further increase the heat dissipation properties.

(Second Embodiment)

A semiconductor light-emitting device of the second embodiment will be described below with reference to FIG. 15A to FIG. 15C.

As shown in FIG. 15A, a semiconductor light-emitting device 580 of the second embodiment differs from the semiconductor light-emitting device 80 of the first embodiment in that a heat dissipation block 570 configured to improve the heat dissipation from the semiconductor light-emitting element 10 is provided over the semiconductor light-emitting element 10, while being in contact with a portion of a second heat sink 530 right above the semiconductor light-emitting element 10, and portions of a post 82*b* at lateral side areas of the semiconductor light-emitting element 10. Configurations different from those of the first embodiment and the first to fourth variations thereof will be described here.

A semiconductor light-emitting device 501 of the present embodiment which is mounted on the post 82b includes, on its second surface 31r which is an upper surface of the second heat sink 530, a metal film 550 and an adhesive layer 551 to which the heat dissipation block 570 is thermally connected, in addition to the third electrode 34 and the fourth electrode 35 on the second surface 31r. The composition of the metal film 550 may be the same as those of the electrodes 34, 35. A layered film of Ti/Pt/Au can be used as the metal film 550, for example. Further, AuSn solder can be used as the adhesive layer, for example.

As shown in FIG. 15B, the heat dissipation block 570 is in an M shape when viewed from a direction perpendicular to the light emission surface of the semiconductor light-emitting element 10, and is thermally connected to both of the second heat sink 530 and the post 82b. The heat dissipation block 570 may be formed of the same material as used for the base body 82a and the post 82b. For example, Cu or Fe can be used.

Further, as shown in FIG. 15C, an electrical connection to the semiconductor light-emitting element 10 is achieved through via electrodes 36, 37 formed in the second heat sink 530 in regions on both lateral sides of the semiconductor light-emitting element 10, through a third electrode 34 and a fourth electrode 35 respectively provided on the via electrodes 36, 37, and through fine gold wires 91, 92 respectively provided on the electrodes 34, 35. It is therefore not necessary to provide an interconnect in the region of the second heat sink 530 right above the semiconductor light-emitting element 10. Further, the Joule heat generated in the semiconductor light-emitting element 10 can be efficiently dissipated to the heat dissipation block 570 through an electrically insulated region.

Thus, similarly to the first embodiment and its variations, an electric connection to the semiconductor light-emitting element 10 can be easily achieved, and the heat dissipation properties of the semiconductor light-emitting element 10 can be further improved.

Now, a method for fabricating the semiconductor light-emitting device of the second embodiment will be described with reference to FIG. 16A and FIG. 16B.

Figure 16A:
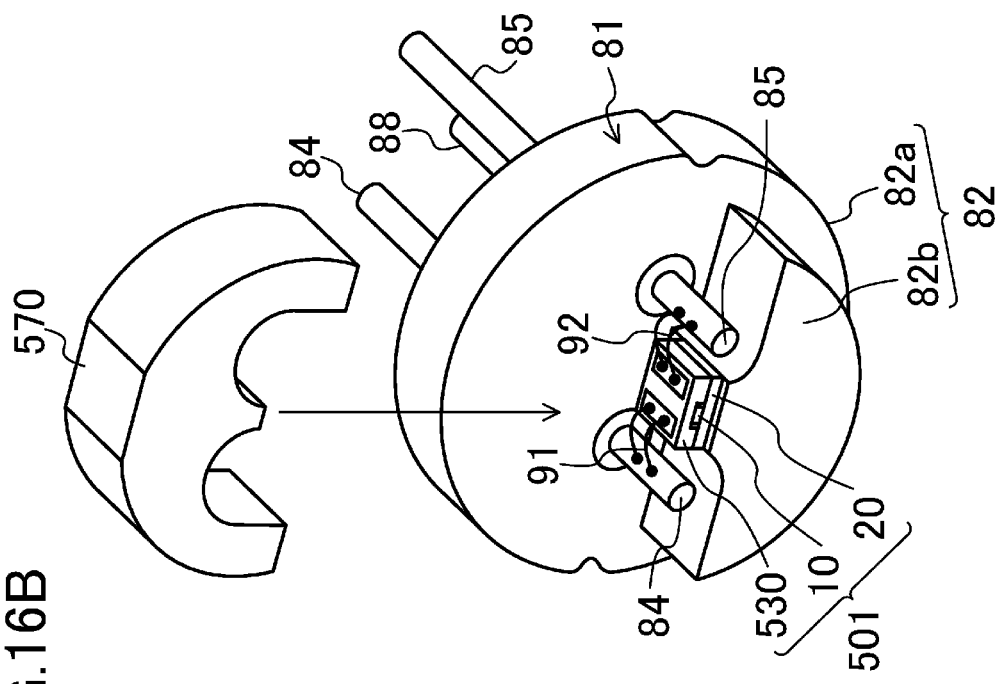
FIG. 16A is a cross-sectional view that illustrates a method for fabricating the semiconductor light-emitting device of the second embodiment.

FIG. 16A shows a method for adhering the first heat sink 20, the semiconductor light-emitting element 10, and the second heat sink 530 together.

Differences from the first embodiment are that in a step of forming the third electrode 34 and the fourth electrode 35 on the upper surface of the second heat sink 530, a metal film 550 having the same composition as that of each of the third electrode 34 and the fourth electrode 35 is selectively formed in a region between the electrodes 34, 35, and that an adhesive layer 551 formed, for example, of AuSn solder is selectively formed on the metal film 550. The other steps are the same as those in the first embodiment.

Figure 16B:
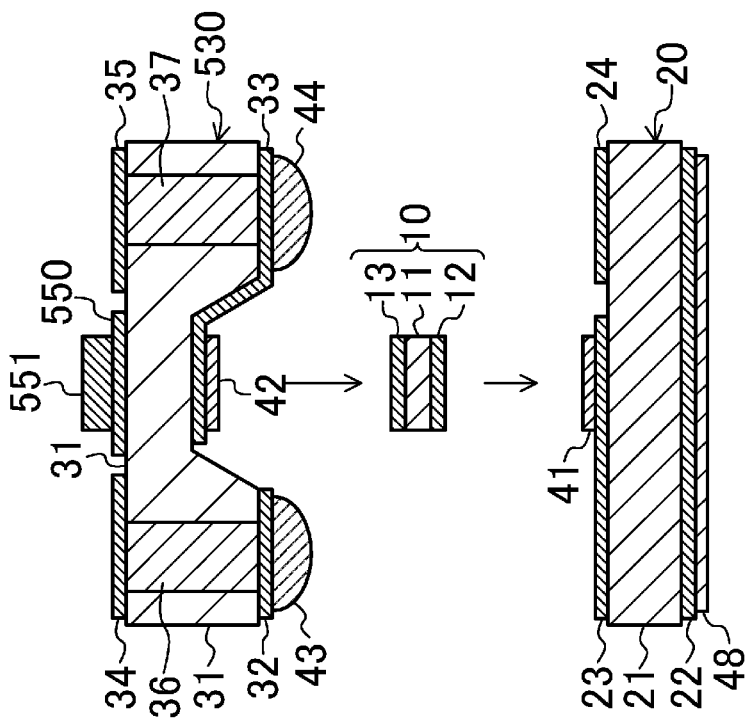
FIG. 16B is an oblique view that illustrates a method for fabricating a semiconductor light-emitting device to which the semiconductor light-emitting device of FIG. 16A is mounted.

Next, as shown in FIG. 16B, the first heat sink 20, the semiconductor light-emitting element 10, and the second heat sink 530 are mounted on a package 81 having the same configuration as that of the package 81 of the first embodiment. The method shown in FIG. 16A can be used as the mounting method at this time. After that, the semiconductor light-emitting device 501 and the lead pins 84, 85 are connected by the fine gold wires 91, 92.

Next, the M-shaped heat dissipation block 570 is placed from above so that the lower surface of the heat dissipation block 570 is connected to the adhesive layer 551 on the second heat sink 530, and to regions of the post 82b on lateral sides of the lead pins 84, 85. The heat dissipation block 570 is adhered by heating. A solder pellet formed, for example, of AuSn solder may intervene between the post 82b and the heat dissipation block 570.

In the configuration described above, the semiconductor light-emitting device 580 of the second embodiment can efficiently dissipate Joule heat from the semiconductor light-emitting element 10 to the outside the semiconductor light-emitting device 580. Thus, the operational properties and reliability of the semiconductor light-emitting element 10 can be significantly improved.

The semiconductor light-emitting device of the present embodiment is applicable in the first embodiment as the semiconductor light-emitting device 1, and is also applicable to the first to third variations.

(Third Embodiment)

A semiconductor light-emitting device of the third embodiment will be described below with reference to FIG. 17.

Figure 17:
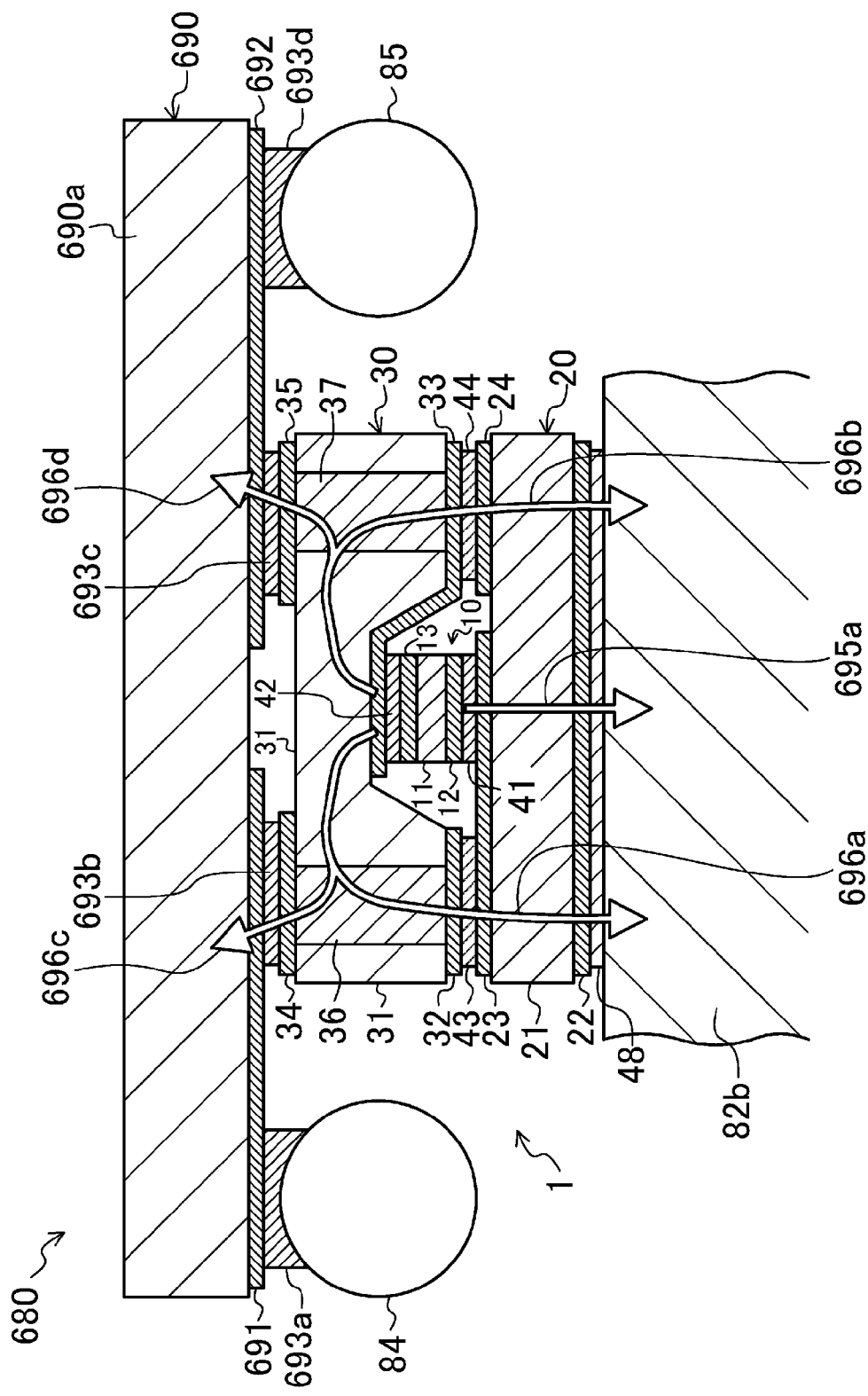
FIG. 17 is a cross-sectional view showing a main part of a semiconductor light-emitting device of the third embodiment of the present disclosure.
Figure 18:
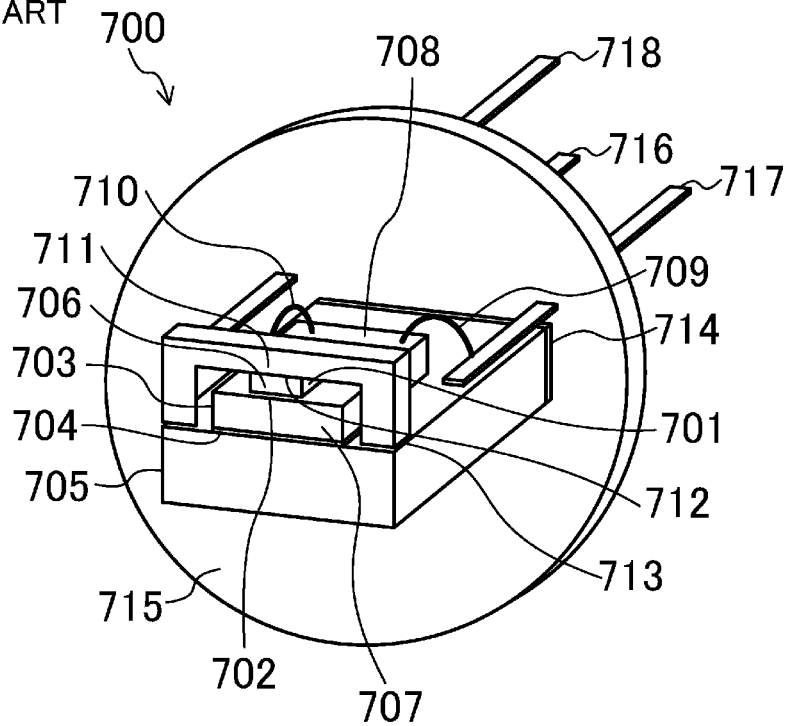
FIG. 18 is an oblique view of a conventional semiconductor light-emitting device.
Figure 19:
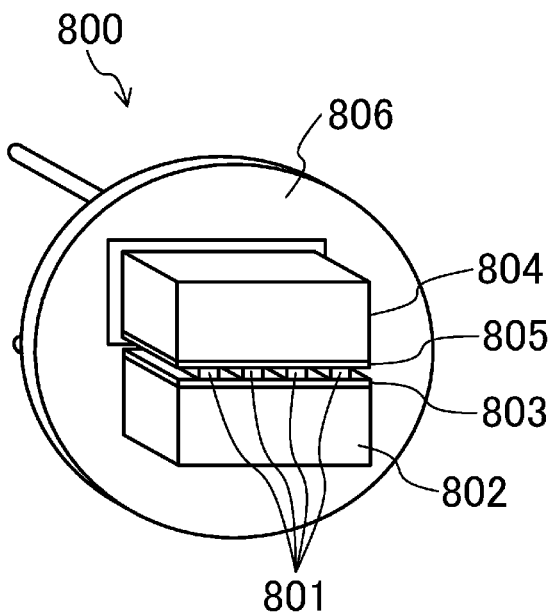
FIG. 19 is an oblique view of another conventional semiconductor light-emitting device.

As shown in FIG. 17, a semiconductor light-emitting device 680 of the third embodiment differs from the semiconductor light-emitting device 1 of the first embodiment in the structure electrically connecting the semiconductor light-emitting device 1 and the lead pins 84, 85. Only the configurations different from those of the first embodiment will be described here.

As shown in FIG. 17, in the present embodiment, the semiconductor light-emitting device 1 and the lead pins 84, 85 are electrically connected by an interconnect member 690, instead of using the fine gold wires 91, 92. The interconnect member 690 is comprised of an insulating member 690a in the form of a plate or a rod, for example, a first interconnect 691 which electrically connects a lead pin 84 for anode and a third electrode 34 on the second heat sink 30, and a second interconnect 692 which electrically connects a lead pin 85 for cathode and a fourth electrode 35 on the second heat sink 30. The first interconnect 691 and the second interconnect 692 are formed on the lower surface of the insulating member 690a.

Specifically, the interconnect member 690 is configured such that the first interconnect 691 and the second interconnect 692 each formed of a layered metal of Ti/Pt/Au, for example, are formed on the lower surface of the insulating material 690a formed, for example, of AlN ceramic. The first interconnect 691 and the third electrode 34 are connected to each other by an adhesive layer 693b formed, for example, of AuSn solder. Similarly, the second interconnect 692 and the fourth electrode 35 are connected to each other by an adhesive layer 693c formed, for example, of AuSn solder. Further, the first interconnect 691 and the lead pin 84 for anode are connected to each other by an adhesive member 693a formed, for example, of SnAgCu solder. Similarly, the second interconnect 692 and the lead pin 85 for cathode are connected to each other by an adhesive member 693d formed, for example, of SnAgCu solder.

Due to this configuration, it is possible to increase a cross-sectional area of the interconnect between the semiconductor light-emitting device 1 and each of the lead pins 84, 85. It is therefore possible to apply electric power in a greater amount of current to the semiconductor light-emitting device 1.

The semiconductor light-emitting device 680 of the third embodiment is fabricated by the following method in which the interconnect member 690 having the above configuration is placed over the light-emitting device 1 and the lead pins 84, 85, which are electrically connected together by applying weight and heat, instead of providing a fine gold wire as in the first embodiment.

Thus, the Joule heat generated in the semiconductor light-emitting element 10 is efficiently dissipated to the outside, e.g., to the base body 82a and the post 82b, by way of a first heat dissipation path 695a through which the heat is transmitted directly to the first heat sink 20, second heat dissipation paths 696a, 696b through which the heat having been transmitted to the second heat sink 30 is transmitted to the first heat sink 20 through the adhesive layers 43, 44, and third heat dissipation paths 696c, 696d through which the heat having been transmitted to the second heat sink 30 is transmitted to the interconnect member 690 through the adhesive layers 693b, 693c. As a result, the heat dissipation properties of the semiconductor light-emitting device 1 are improved, thereby making it possible to increase the electric power to be supplied to the semiconductor light-emitting element 10.

The semiconductor light-emitting device of the present embodiment is applicable in the first embodiment as the semiconductor light-emitting device 1 and is also applicable to the first to third variations.

The semiconductor light-emitting device of the present disclosure is useful as a light source of a semiconductor light-emitting device which requires relatively high optical output, such as image display devices, e.g., a laser display and a projector, or laser equipment for industrial use, e.g., laser processing and laser annealing.

What is claimed is:

1. A semiconductor light-emitting device, comprising:
   a first heat sink formed of an insulating member;
   a second heat sink formed of an insulating member, facing the first heat sink with a cavity therebetween, and thermally connected to the first heat sink; and
   a semiconductor light-emitting element held in the cavity and connected to the first heat sink and the second heat sink, wherein
   the second heat sink has a first electrode and a second electrode on a first surface of the second heat sink facing the first heat sink, and a third electrode and a fourth electrode on a second surface of the second heat sink opposite to the first surface,
   the first electrode is electrically connected to a lower electrode of the semiconductor light-emitting element,
   the second electrode is electrically connected to an upper electrode of the semiconductor light-emitting element, and
   the first electrode and the third electrode are electrically connected to each other, and the second electrode and the fourth electrode are electrically connected to each other.

2. The semiconductor light-emitting device of claim 1, wherein
   the first electrode and the third electrode are electrically connected to each other by a first via electrode which penetrates the second heat sink, and
   the second electrode and the fourth electrode are electrically connected to each other by a second via electrode which penetrates the second heat sink.

3. The semiconductor light-emitting device of claim 1, wherein
   the first electrode and the third electrode are electrically connected to each other by a first conductive film formed on one of side surfaces of the second heat sink, and
   the second electrode and the fourth electrode are electrically connected to each other by a second conductive film formed on the other side surface of the second heat sink.

4. The semiconductor light-emitting device of claim 1, wherein the cavity is a recess formed in at least one of the first heat sink or the second heat sink.

5. The semiconductor light-emitting device of claim 1, wherein the cavity is a cavity between two conductive members placed between the first heat sink and the second heat sink.

6. The semiconductor light-emitting device of claim 1, wherein
   each of the first heat sink and the second heat sink is formed of an insulating material having a first thermal expansion coefficient,
   the semiconductor light-emitting element is formed of a material having a second thermal expansion coefficient, and
   a thermal expansion coefficient difference between the first thermal expansion coefficient and the second thermal expansion coefficient is within a range of −40% to 40%.

7. The semiconductor light-emitting device of claim 6, wherein the insulating material is aluminum nitride ceramic, silicon carbide ceramic, alumina ceramic, or silicon.

8. The semiconductor light-emitting device of claim 1, further comprising:
   a base to which the first heat sink is adhered; and
   a first lead pin and a second lead pin electrically insulated from the base,
   wherein the third electrode is electrically connected to the first lead pin, and
   the fourth electrode is electrically connected to the second lead pin.

9. The semiconductor light-emitting device of claim 8, wherein the base includes a post which is thermally conductive, and a base body which holds the first lead pin and the second lead pin.

10. The semiconductor light-emitting device of claim 9, further comprising:
    a heat dissipation block which is thermally connected to portions of an upper surface of the post at lateral side areas of the first heat sink, and to an upper surface of the second heat sink.

11. The semiconductor light-emitting device of claim 8, wherein
    the base is comprised of a base body to which a third lead pin is connected, and
    the semiconductor light-emitting device further includes a package that holds the base body, the first lead pin, the second lead pin, and the third lead pin.

12. The semiconductor light-emitting device of claim 8, further comprising:
    an interconnect member which electrically connects the third electrode and the first lead pin, and electrically connects the fourth electrode and the second lead pin,
    wherein the interconnect member includes:
        a first interconnect electrically connected to the first lead pin,
        a second interconnect electrically connected to the second lead pin, and
        an insulating member which holds the first interconnect and the second interconnect.

* * * * *